(12) United States Patent
Das et al.

(10) Patent No.: US 11,621,355 B2
(45) Date of Patent: Apr. 4, 2023

(54) BIOMIMETIC 2D TRANSISTOR FOR AUDIOMORPHIC COMPUTING

(71) Applicant: THE PENN STATE RESEARCH FOUNDATION, University Park, PA (US)

(72) Inventors: Saptarshi Das, State College, PA (US); Sarbashis Das, State College, PA (US); Akhil Dodda, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 17/595,741

(22) PCT Filed: Jul. 28, 2020

(86) PCT No.: PCT/US2020/043871
§ 371 (c)(1),
(2) Date: Nov. 23, 2021

(87) PCT Pub. No.: WO2021/021805
PCT Pub. Date: Feb. 4, 2021

(65) Prior Publication Data
US 2022/0157995 A1    May 19, 2022

Related U.S. Application Data

(60) Provisional application No. 62/880,983, filed on Jul. 31, 2019.

(51) Int. Cl.
*H01L 29/786* (2006.01)
*H01L 29/423* (2006.01)
(Continued)

(52) U.S. Cl.
CPC .... *H01L 29/78648* (2013.01); *H01L 27/1251* (2013.01); *H01L 29/24* (2013.01);
(Continued)

(58) Field of Classification Search
CPC .......... H01L 29/78648; H01L 27/1251; H01L 29/24; H01L 29/42384; H01L 29/78696; H01L 51/0554
(Continued)

(56) References Cited

U.S. PATENT DOCUMENTS

2013/0328017 A1* 12/2013 Chen ................ H01L 29/78
257/29
2016/0374585 A1    12/2016 Fonash et al.

FOREIGN PATENT DOCUMENTS

WO    2012050646 A3    4/2012
WO    2018036413 A1    1/2018

OTHER PUBLICATIONS

The International Search Report and The Written Opinion for PCT/US2020/043871 filed Jul. 28, 2020, dated Feb. 4, 2021.

\* cited by examiner

*Primary Examiner* — Tong-Ho Kim
(74) *Attorney, Agent, or Firm* — Buchanan Ingersoll & Rooney PC

(57) ABSTRACT

Embodiments relate to a computing device that may be configured as a biomimetic audiomorphic device. The device can include a field effect transistor (FET) having a split-gate architecture with different spacing between the split-gates. Embodiments of the device can include multiple split-gates. Some embodiments include the integration of delay elements and tunable resistor-capacitance (RC) circuits for imitating the interaural time delay neurons. Some embodiments include global back-gating structural features to provide neuroplasticity aspects so as to provide adaptation related changes.

15 Claims, 32 Drawing Sheets

(51) Int. Cl.
*H01L 29/24* (2006.01)
*H01L 27/12* (2006.01)
*H01L 51/05* (2006.01)

(52) U.S. Cl.
CPC .. *H01L 29/42384* (2013.01); *H01L 29/78696* (2013.01); *H01L 51/0554* (2013.01)

(58) Field of Classification Search
USPC .......................................................... 257/40
See application file for complete search history.

FIG. 10A  FIG. 10B

BIOMIMETIC 2D TRANSISTOR FOR AUDIOMORPHIC COMPUTING

CROSS-REFERENCE TO RELATED APPLICATIONS

This application is a U.S. national stage application under 35 U.S.C. § 371 for International Patent Application No. PCT/US2020/043871, filed on Jul. 28, 2020, which is related to and claims the benefit of priority of U.S. provisional application 62/880,983, filed Jul. 31, 2019, the entire contents of each is incorporated herein by reference.

STATEMENT REGARDING FEDERALLY SPONSORED RESEARCH OR DEVELOPMENT

This invention was made with government support under Grant No. FA9550-17-1-0018 awarded by the United States Air Force/AFOSR. The Government has certain rights in the invention.

FIELD OF THE INVENTION

Embodiments relate to a biomimetic audiomorphic device. The device can include a field effect transistor (FET) having a split-gate architecture. Embodiments of the device can include multiple split-gates with different spacings between the split-gates of the split-gate architecture. Some embodiments include the integration of delay elements and tunable resistor-capacitance (RC) circuits for imitating interaural time delay neurons. Some embodiments include global back-gating structural features to provide neuroplasticity or reconfigurability aspects to the device.

BACKGROUND OF THE INVENTION

Supercomputers have become so powerful that they can easily surpass the performance and capacity of the human brain in processing speed and amount of information storage.

However, there exists a gap in energy consumption and area efficiency between the human brain and the supercomputers with the supercomputers being at least 1000000× less efficient than the human brain. The emerging era of neuromorphic computing promises to shrink this gap by deploying artificial neural networks (ANNs). ANNs mimic the fundamental computing unit of brain i.e. neurons connected to other neurons via synapses. Neuromorphic chips, such as TrueNorth, Loihi, BrainScale and SpiNNaker are some examples of advancements in the area of artificial intelligence, however, these chips will still remain overwhelmingly power hungry when scaled up to the full capacity of human brain, which has ~100 billion neurons connected via 1 quadrillion synapses operating at a miniscule ~20 W power.

BRIEF SUMMARY OF THE INVENTION

Embodiments relate to a biomimetic audiomorphic device. The device can include a field effect transistor (FET) having a split-gate architecture. Embodiments of the device can include multiple split-gates with different spacings between the split-gates of the split-gate architecture. Some embodiments include the integration of delay elements and tunable resistor-capacitance (RC) circuits for imitating interaural time delay neurons. Some embodiments include global back-gating structural features to provide neuroplasticity or reconfigurability aspects to the device.

In an exemplary embodiment, the biomimetic audiomorphic device includes: a substrate to serve as a back-gate; an insulator or oxide layer formed on the substrate to serve as a back-gate dielectric; a semiconducting channel formed on the back-gate dielectric layer; metallic layers formed in and/or on the semiconducting channel to define the source and the drain contacts; an insulator or oxide layer to serve as a top-gate dielectric; a metallic layer formed on the top-gate dielectric to define the split-gate pair, the split-gate pair comprising a first gate and a second gate. The first gate is formed between the source and the drain located on a first side of the FET device; the second gate is formed between the source and the drain on a second side of the FET device; and the first gate is physically separated from the second gate.

In some embodiments, the substrate is Si; however, any substrate can be used. In addition, the substrate can be flexible or rigid.

In some embodiments, the back-gate oxide layer is $SiO_2$; however, any oxide can be used such as $Al_2O_3$, $HfO_2$, h-BN, etc.

In some embodiments, the semiconducting channel is $MoS_2$; however, any organic or inorganic semiconductor can be used, such as other 2D materials, Si, oxide semiconductors, compound semiconductors, etc.

In some embodiments, the metallic layer is a stack of nickel or gold; however, any metal stack can be used. For instance, the source, drain, and gate contact can be metals, semi-metal, and heavily doped semiconducting materials.

In some embodiments, the top-gate oxide layer is Hydrogen silsesquioxane (HSQ); however, any oxide can be used such as $Al_2O_3$, $HfO_2$, h-BN, etc.

In some embodiments, the biomimetic audiomorphic device, when in operation: the back-gate is biased at a voltage $V_{BG}$, source is grounded and drain is biased at a drain-to-source voltage $V_{DS}$, the first split-gate is biased at a split-gate voltage $V_{SG1}$, the second split-gate is biased at a split-gate voltage $V_{SG2}$, and a source-to-drain current $I_{DS}$ flows through the channel.

In some embodiments, plurality of split-gate pairs are used.

Each split gate is physically separated from any other split gate.

In some embodiments, each split-gate pair is separated by a distance, d, and: the distance between the first split-gate pair and the second split-gate pair is $d_1$; the distance between the second split-gate pair and the third split-gate pair is $d_2$; the distance between the third split-gate pair and the fourth split-gate pair is $d_3$; the distance between the fourth split-gate pair and the fifth split-gate pair is $d_4$; and $d_1=d_2=d_3=d_4$.

In some embodiments, $d_1=400$ nm, $d_2=400$ nm, $d_3=400$ nm, and $d_4=400$ nm.

However, any spacing, d, between the split-gate pairs can be used.

In some embodiments, each first gate and second gate of each split gate pair is separated by a distance, s, and: the distance between the first gate and the second gate of the first split-gate pair is $s_1$; the distance between the first gate and the second gate of the second split-gate pair is $s_2$; the distance between the first gate and the second gate of the third split-gate pair is $s_3$; the distance between the first gate and the second gate of the fourth split-gate pair is $s_4$; the distance between the first gate and the second gate of the fifth split-gate pair is $s_5$; and $s_5>s_4$, $s_4>s_3$, $s_3>s_2$, and $s_2>s_1$.

In some embodiments: $s_1$=200 nm, $s_2$=300 nm, $s_3$=400 nm, $s_4$=500 nm, and $s_5$=600 nm. However, any spacing, s, between the first gate and second gate in the split-gate pair can be used.

In some embodiments, the biomimetic audiomorphic device further includes a plurality of fullytop-gated field effect transistor (FET) devices or resistors made out of any technology.

In an exemplary embodiment, a fullytop-gated FET device includes: a substrate to serve as a back-gate; an insulator or oxide layer formed on the substrate to serve as a back-gate dielectric; a semiconducting channel formed on the back-gate dielectric layer; metallic layers formed in and/or on the semiconducting channel to define the source and the drain contacts; an insulator or oxide layer to serve as a top-gate dielectric; metallic layer formed on the top-gate dielectric to define the top-gate.

In some embodiments, the fully-top gated FET device, when in operation: the back-gate is biased at a voltage $V_{BG}$, source is grounded and drain is biased at a drain-to-source voltage $V_{DS}$, the top-gate is biased at a voltage $V_{TG}$, and a source-to-drain current $I_{DS}$ flows through the channel.

In an exemplary embodiment, each individual split-gate is connected to the drain of an individual fullytop-gated FET device.

Further features, aspects, objects, advantages, and possible applications of the present invention will become apparent from a study of the exemplary embodiments and examples described below, in combination with the Figures, and the appended claims.

BRIEF DESCRIPTION OF THE FIGURES

The above and other objects, aspects, features, advantages, and possible applications of the present invention will be more apparent from the following more particular description thereof, presented in conjunction with the following drawings. It should be understood that like reference numbers used in the drawings may identify like components.

DETAILED DESCRIPTION OF THE INVENTION

The following description is of an embodiment presently contemplated for carrying out the present invention. This description is not to be taken in a limiting sense but is made merely for the purpose of describing the general principles and features of the present invention. The scope of the present invention should be determined with reference to the claims.

Figure 1:
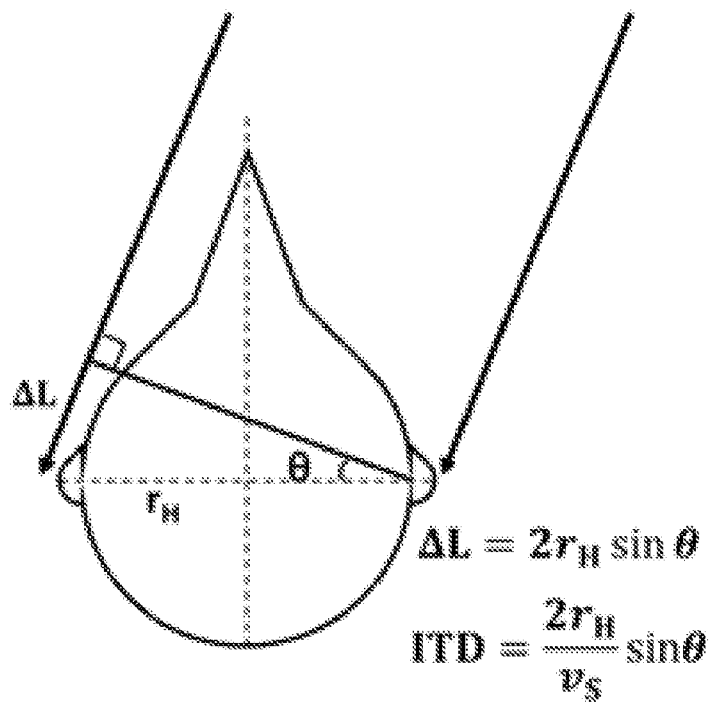
FIG. 1 shows how the path difference between the sound waves reaching the two ears is translated into interaural time difference (ITD) for an acoustic source located at an azimuth angle, θ, for a given head radius ($r_H$) and sound velocity ($v_S$).
Figure 2:
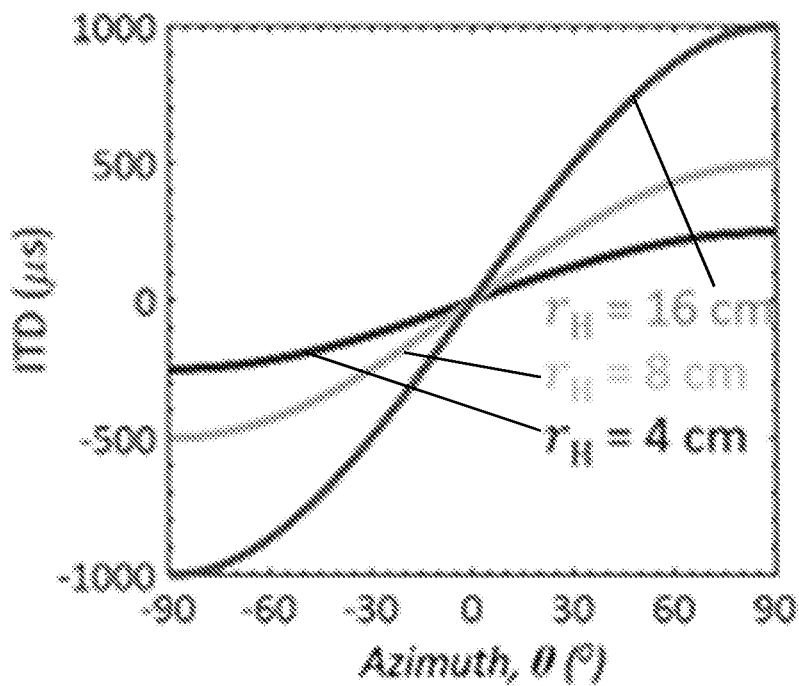
FIG. 2 shows ITD as a function of θ for different head sizes.

In developing the biomimetic audiomorphic device 104, as well as the components and other aspects of the biomimetic audiomorphic device 104, the inventors used the auditory signal processing of a barn owl as a model. The ability to localize sound is an essential survival feature for predators and preys alike explaining why terrestrial vertebrates have two ears so that the interaural time difference (ITD) of low frequency sound waves can be used as a cue to determine the direction of its source. FIG. 1 shows how the path difference between the sound waves reaching the two ears is translated into ITD for an acoustic source located at an azimuth angle, θ, for a given head radius ($r_H$) and sound velocity ($v_S$). FIG. 2 shows ITD as a function of θ for different head sizes. Clearly, for typical size of animal heads it is imperative that the auditory information must be processed within hundreds of microseconds using neurons which can fire only once per few milliseconds. Therefore, auditory signal processing is a challenging computational task for any animal. Remarkably, this problem has been evolutionarily resolved using smart neural algorithms implemented through befitting neurobiological architectures. In this context, barn owls are model auditory systems owing to their extraordinary ability to determine the location of sound with a precision of 1-2 degrees even when hunting in total darkness. In 1948, Lloyd Jeffress published a seminal paper, where he formulated a model that describes how acoustic timing differences are represented as a "place" in an array of nerve cells or in other words how the brain transforms temporal coding into spatial coding. Remarkably, the key assumptions of his model are valid even today. In fact, the Jeffress model remains as the cornerstone for the neurophysiological understanding and development of most computational models for sound localization.

Figure 3:
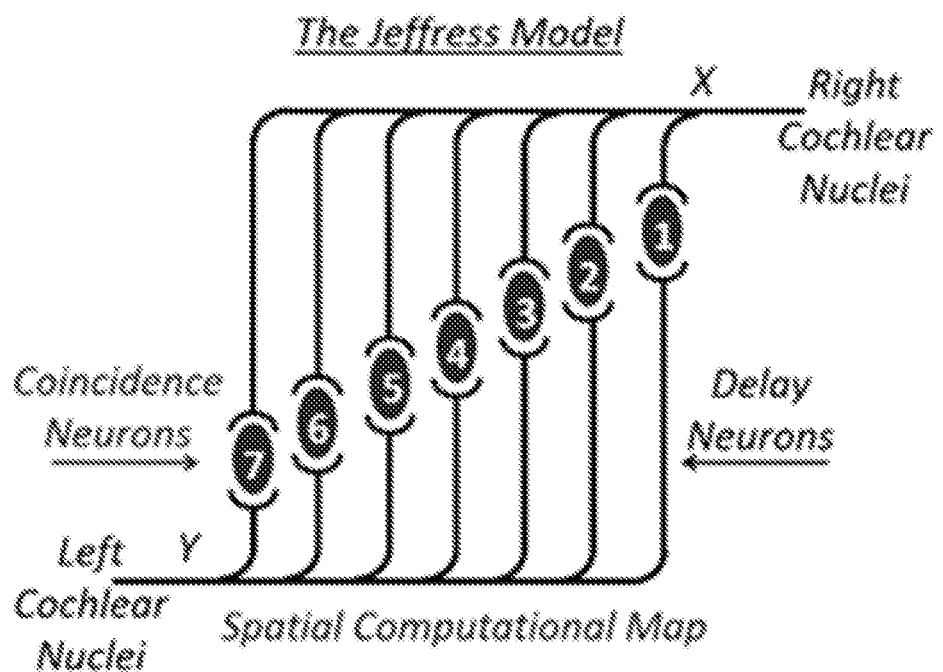
FIG. 3 depicts the Jeffress model with three essential neural components: (1) the time delay neurons, (2) the coincidence detector neurons, and (3) a spatial computational map that correlates the two.

FIG. 3 depicts the Jeffress model with three essential neural components: (1) the time delay neurons, (2) the coincidence detector neurons, and (3) a spatial computational map that correlates the two. The coincidence neurons fire only when spikes arrive concurrently to the corresponding delay neurons. The length of the delay neurons from the left and right cochlear nuclei is equal up to the points X and Y. However, beyond these points these delay neurons are projected onto coincidence neurons in a ladder-like branching structure that runs in opposite directions. The delay neurons from the right side form a set of collaterals so that the axonal length to the coincidence neuron is longer for cell 7 than for cell 1 and vice versa for the delay neurons from the left side. Due to the finite speed of axonal conduction, these branching patterns constitute a map for the ITDs, and hence correlates to the spatial location of the sound source. For example if a sound originates from straight ahead, it will reach the right and left cochlea at the same time, i.e. without any interaural delay (ITD=0 μs). In this case only neuron 4 will receive coincident inputs since the total axonal path lengths are equal. However, if the sound originates from the left hemisphere, it will reach the left ear earlier than the right ear. In this case, coincidence will occur if the input signal from the left travels a longer path length than that from the right by an amount that exactly offsets the acoustic delay, e.g., at cell 1. Similarly, if the sound originates from the right hemisphere, coincidence will occur e.g., at cell 7. Therefore, the spatial projection of the right and left delay neurons onto the coincidence neurons form a computational map where each coincidence neuron represents a specific ITD corresponding to an azimuth.

Figure 4:
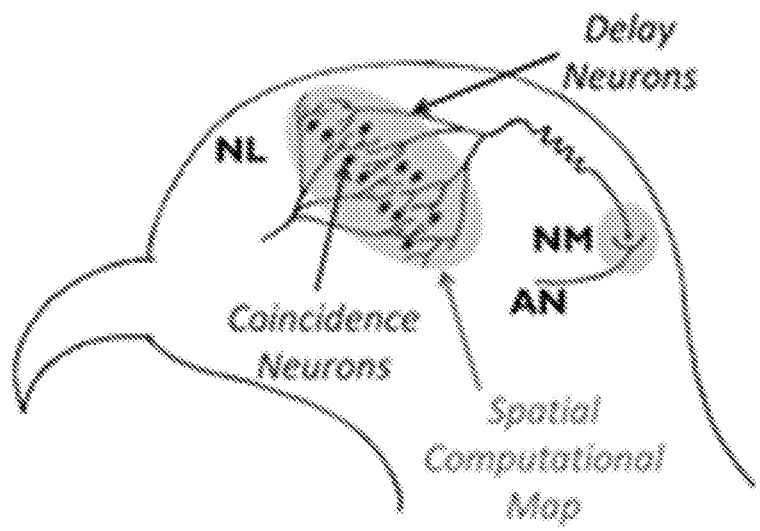
FIG. 4 shows a simple anatomical drawing of barn owl's brainstem which bears astonishing similarity with the Jeffress model.

FIG. 4 shows a simple anatomical drawing of barn owl's brainstem which bears astonishing similarity with the Jeffress model. In the barn owl, the axons of secondary nerve fibers from the nucleus magnocellularis (NM) provide the delay lines. These monaural channels originate from left and right cochlear nuclei and converge on binaural tertiary nerve fibers which serve as coincidence detectors in the nucleus laminaris (NL). Neurons in NL only discharge on receiving coincident spikes from their monaural, excitatory afferents.

Figure 5:
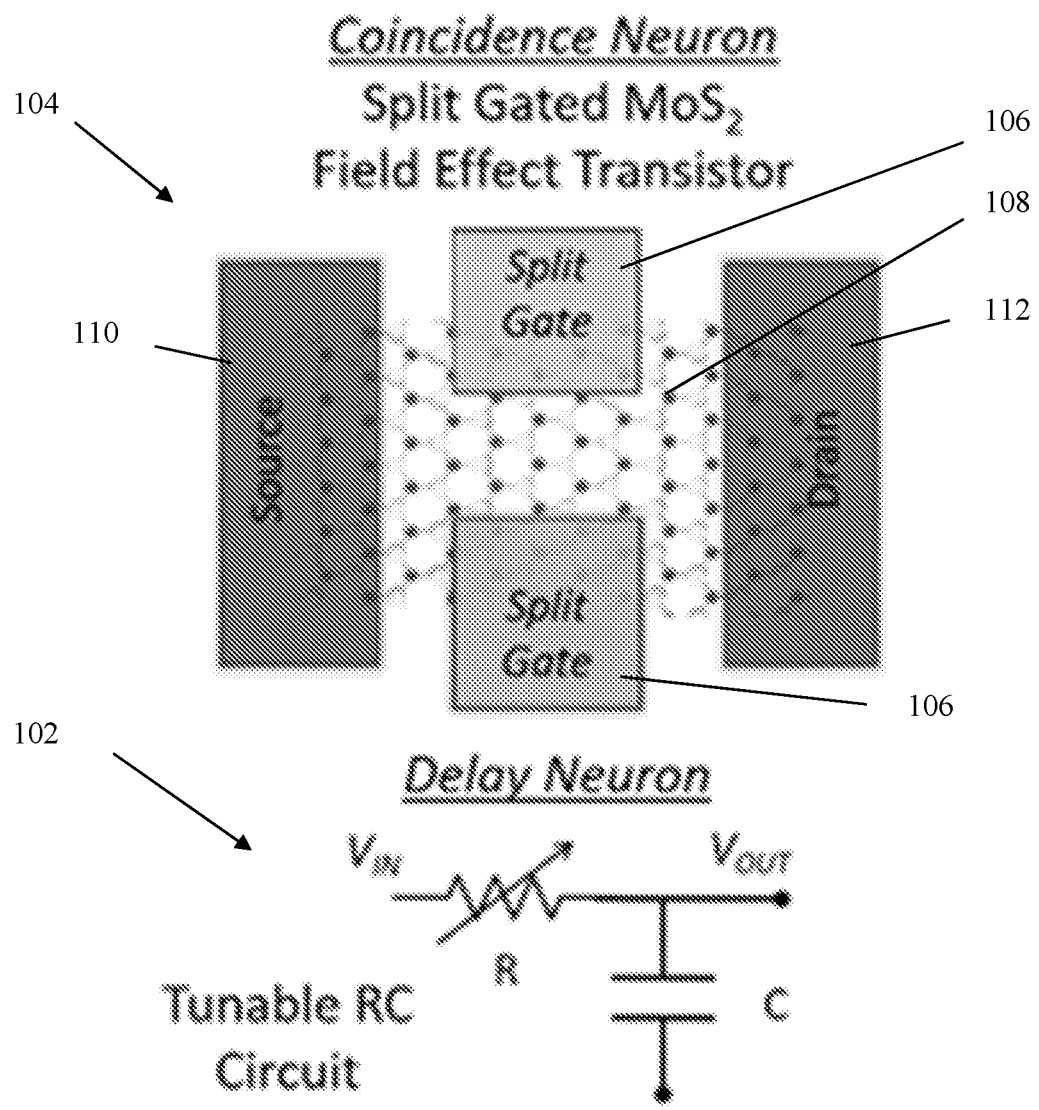
FIG. 5 shows exemplary schematics of an embodiment of the biomimetic audiomorphic device configured to simulate a solid-state coincidence detector neuron and an embodiment of a tunable resistor-capacitor (RC) circuit configured to simulate a delay neuron.

FIG. 5 shows exemplary schematics of an embodiment of the biomimetic audiomorphic device 104 configured to simulate a solid state coincidence detector neuron and an embodiment of a tunable resistor-capacitor (RC) circuit 102 configured to simulate a delay neuron. As will be explained in detail herein, embodiments of the biomimetic audiomorphic device 104 can include a split-gated $MoS_2$ field effect transistor (FET) architecture used to achieve the functionality of coincidence detector neuron, wherein the tunable resistor-capacitor (RC) circuit 102 is used to mimic delay neurons.

Figure 6:
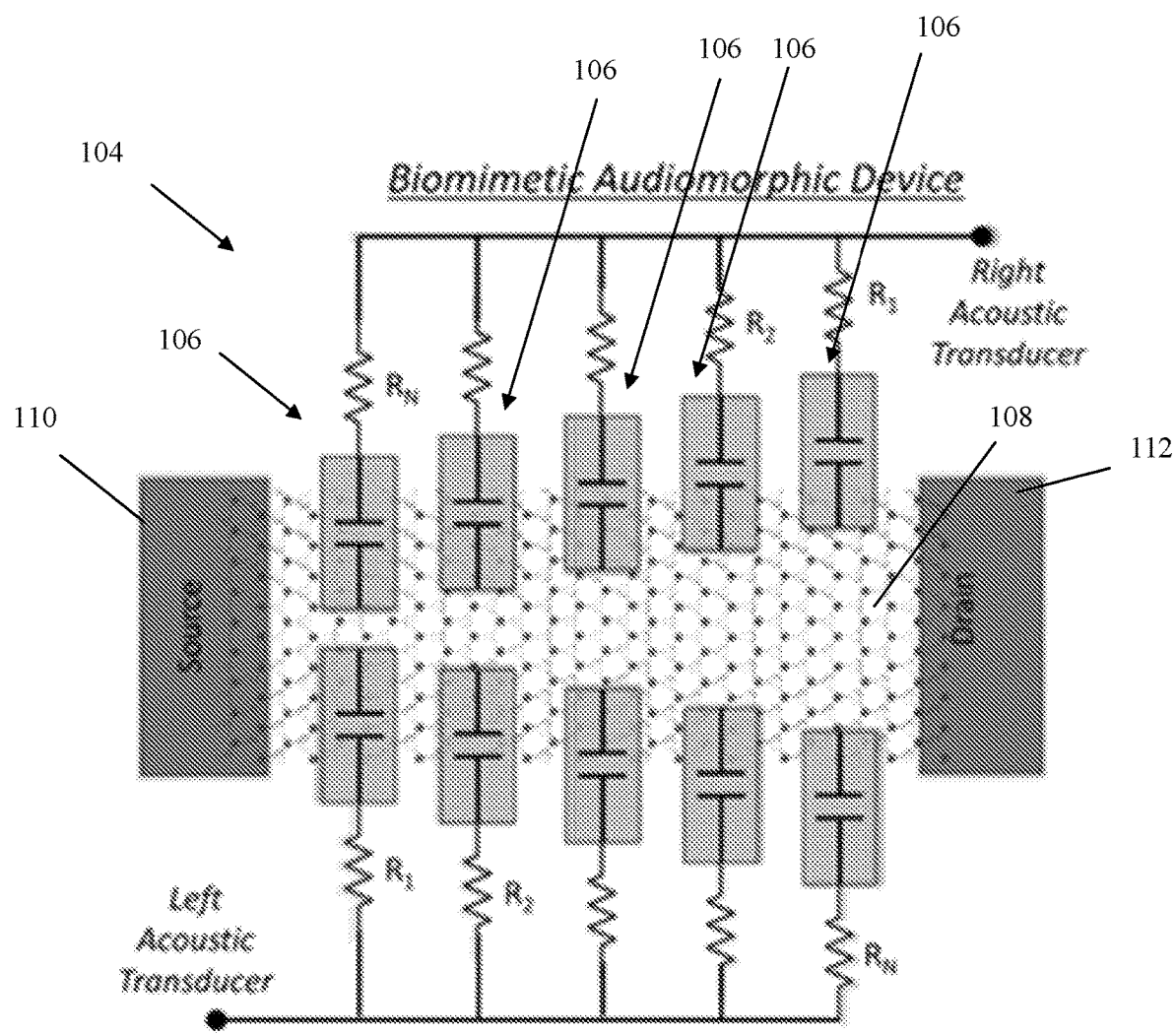
FIG. 6 shows an exemplary schematic of an embodiment of a fully integrated biomimetic audiomorphic device in order to emulate the neural computational map inside the auditory cortex of barn owl following the Jeffress model.

FIG. 6 shows an exemplary schematic of an embodiment of a fully integrated biomimetic audiomorphic device 104 in order to emulate the neural computational map inside the auditory cortex of barn owl following the Jeffress model. As can be seen from FIG. 6, the biomimetic audiomorphic device 104 includes multiple FET devices 100 having multiple split-gates 106 with different widths of the ungated region on a single channel 108. The channel is connected to the source 110 and drain 112 terminals of the biomimetic audiomorphic device 104 to realize the computational map. Each split-gate 106 is connected to a delay line resistor with the resistance value designed in accordance with the spatial location of the corresponding split-gate 106. With such a configuration, a single biomimetic audiomorphic device 104 can perform biomimetic audiomorphic computing by concurrently performing digital and analog computations.

In the exemplary embodiments, $MoS_2$ is selected as the semiconducting material for the FET device 100 channel 108 material. It should be noted that selection of $MoS_2$ as the semiconducting channel material is exemplary only. It should be understood that embodiments of the biomimetic audiomorphic device 104 need not be restricted to a $MoS_2$ FET, rather any semiconducting material that allows for the implementation of the split-gate FET geometry can be used.

It is relatively straightforward to recognize that a coincident neuron acts like a two input AND gate because it fires maximum number of output spikes only when it receives signals from both the left and the right delay neurons at the same time. Coincidence circuits are known for their ability to greatly minimize the chance of a false detection. If the probability of falsely identifying a noise pulse as a genuine signal by one detector is P, then the probability of false detection when two detectors detect the signal pulse simultaneously is $P^2$. Therefore, if P=0.1, then $P^2$=0.01. Thus, the probability of false detection can be significantly reduced by the use of coincidence detection.

Figure 7:
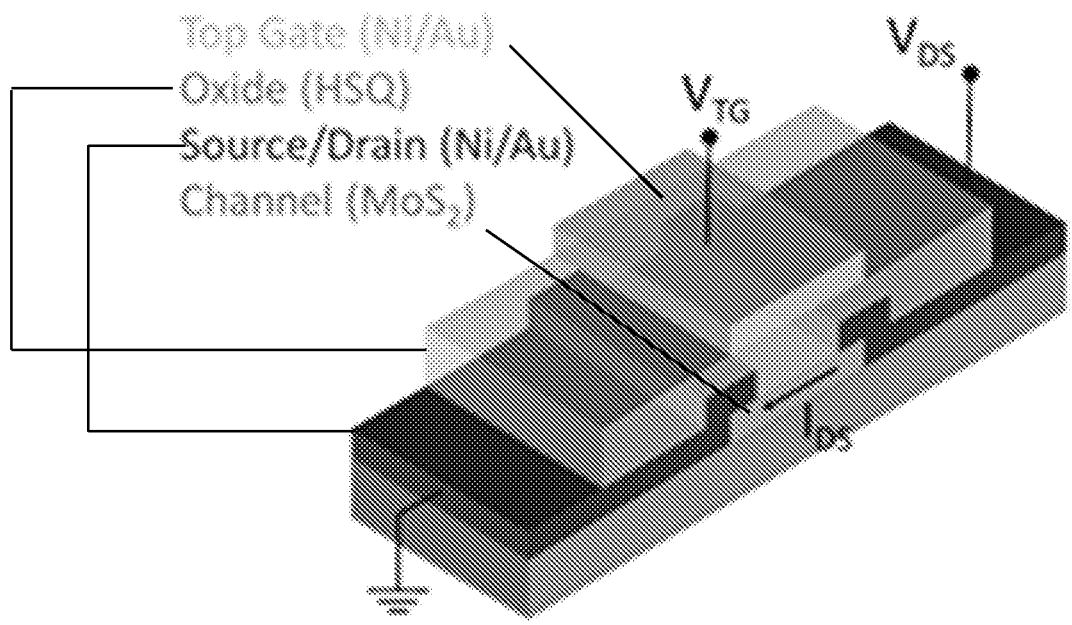
FIG. 7 shows an exemplary schematic of a fully top-gated $MoS_2$ FET on a conventional Si substrate.

FIG. 7 shows an exemplary schematic of a fully top-gated MoS$_2$ FET on a conventional Si substrate. The semiconducting MoS$_2$ channel is few atomic layers thick and is connected to Ni/Au metal contacts that serve as the source/drain terminals. 120 nm of hydrogen silsesquioxane (HSQ) is used as the top-gate dielectric and Ni/Au is used as the top-gate electrode.

Figures 8A, 8B:
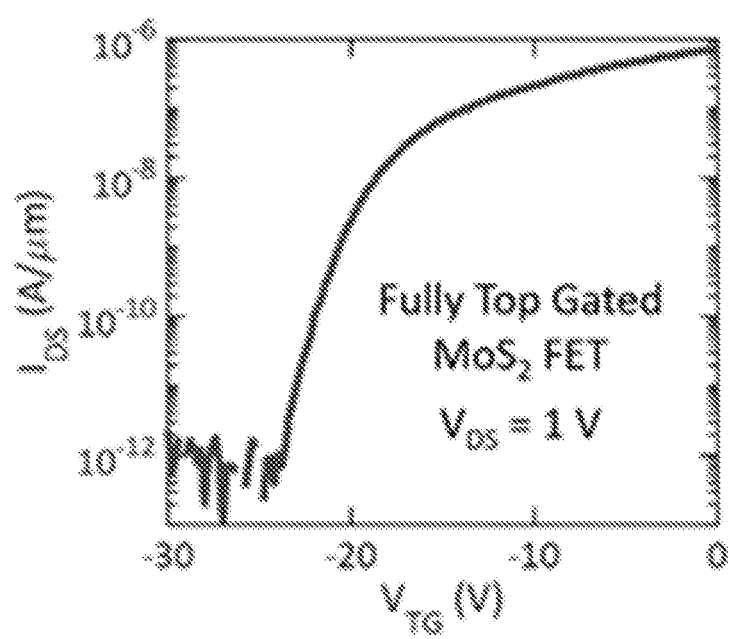
FIG. 8A shows the transfer characteristics, i.e. the source to drain current ($I_{DS}$) as a function of the top-gate voltage ($V_{TG}$) for a source to drain voltage of $V_{DS}$=1 V of an embodiment of the device of FIG. 7.
FIG. 8B shows a corresponding truth table.

FIG. 8A shows the transfer characteristics of the device—e.g., source to drain current ($I_{DS}$) versus top-gate voltage ($V_{TG}$) for a drain bias, $V_{DS}$=1V. The device is normally ON at $V_{TG}$=0V due to unintentional n-type doping and metal Fermi level pinning close to the conduction band of MoS$_2$ and can be gradually turned OFF by applying negative $V_{TG}$. A high current ON/OFF ratio of ~10$^6$ is achieved and the device can be treated as a one-input-one-output digital element represented by the truth table shown in FIG. 8B. Evidently this device cannot represent an AND logic.

Figure 9:
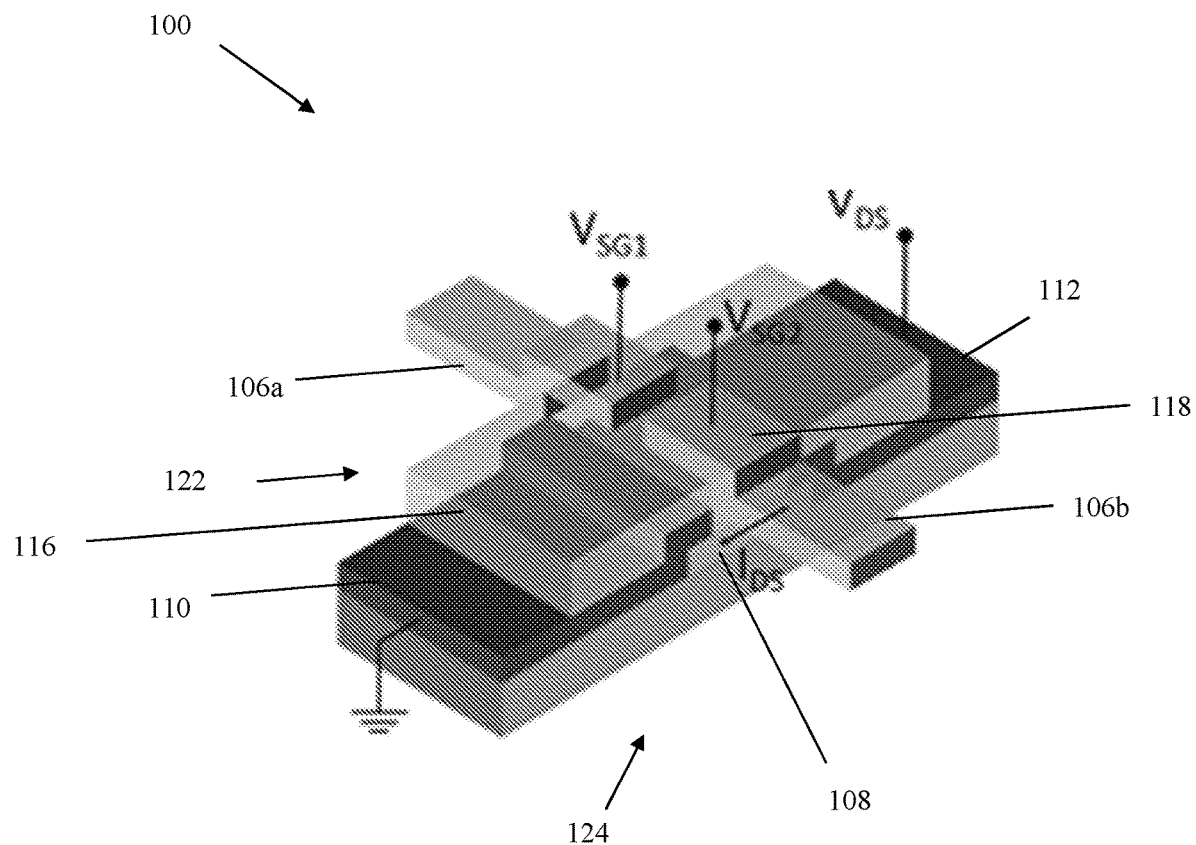
FIG. 9 shows the schematic of a $MoS_2$ FET with a split-gate architecture.

On the contrary, FIG. 9 shows the schematic of a MoS$_2$ FET device 100. The FET device 100 includes a MoS$_2$ semiconducting material exfoliated on Si/SiO$_2$ gate stack. An oxide layer 116 can be formed in and/or on at least a portion of the source 110 and at least a portion of the drain 112 so as to span a length between the source 110 and the drain 112. The semiconducting region MoS$_2$ 108 which is underneath the oxide layer 116 is the active region of operation and lies between source 110 and drain 112. A metallic layer 118 can be formed on top of the oxide layer 116, wherein the metallic layer 118 and the oxide layer 116 form a split-gate 106. The split-gate 106 includes a first gate 106a formed between the source 110, the drain 112, and a MoS$_2$ semiconducting material 108 on a first side 122 of the FET device 100. The split-gate 106 includes a second gate 106b formed between the source 110, the drain 112, and a MoS$_2$ semiconducting channel material 108 on a second side 124 of the FET device 100. The first gate 106a is physically separated from the second gate 106b. In this configuration, the source 110 may be connected to ground so that in operation, the drain 112 is biased at a drain-source voltage $V_{DS}$, the first gate 106a is biased at a split-gate voltage $V_{SG1}$, the second gate 106b is biased at a split-gate voltage $V_{SG2}$, and a drain-source current $I_{DS}$ flows through the channel 108. The source 110 and drain 112 voltages are biased at 0 and 1V respectively and the current $I_{DS}$ flows from drain 112 to source 110. The split gates $V_{SG1}$ 106a and $V_{SG2}$ 106b correspondingly modulate the drain to source current when biases are applied.

Figure 10:
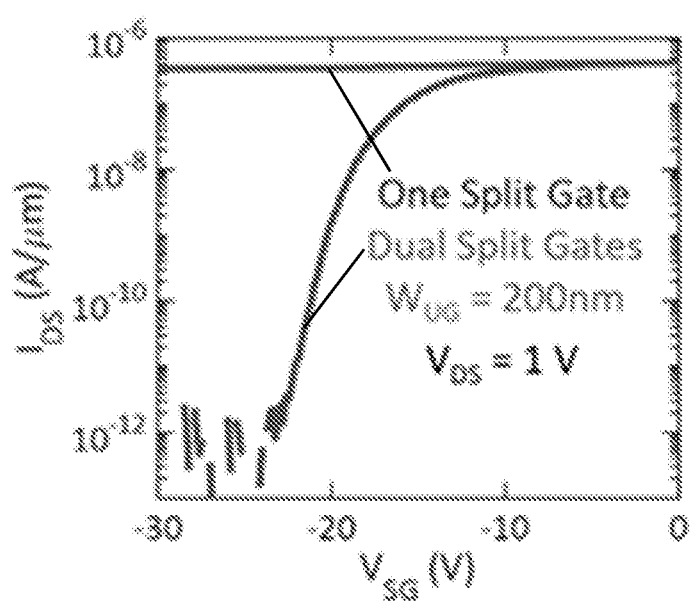
FIG. 10A shows the transfer characteristics, i.e. the source to drain current ($I_{DS}$) as a function of the split-gate voltage ($V_{SG}$) for a source to drain voltage of $V_{DS}$=1 V of an embodiment of the device of FIG. 9.
FIG. 10B shows the corresponding truth table.
Figure 11:
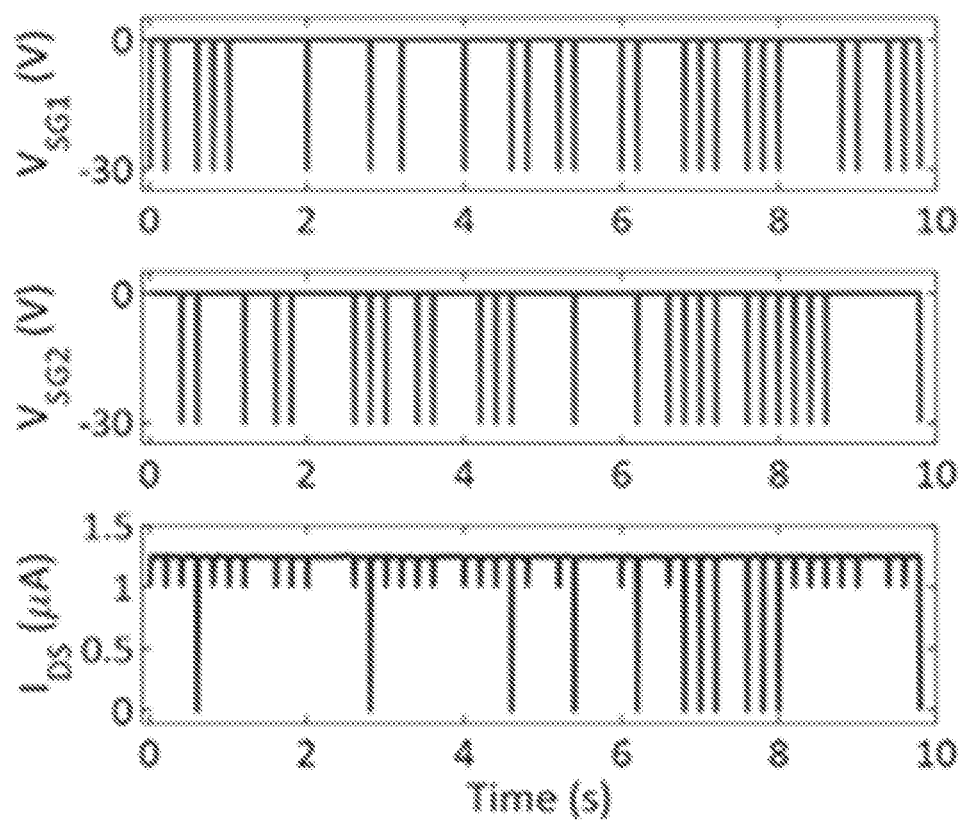
FIG. 11 shows the source to drain current ($I_{DS}$) versus time for random voltage pulses of amplitude −30 V applied to the split gates of FIG. 9.
Figure 12:
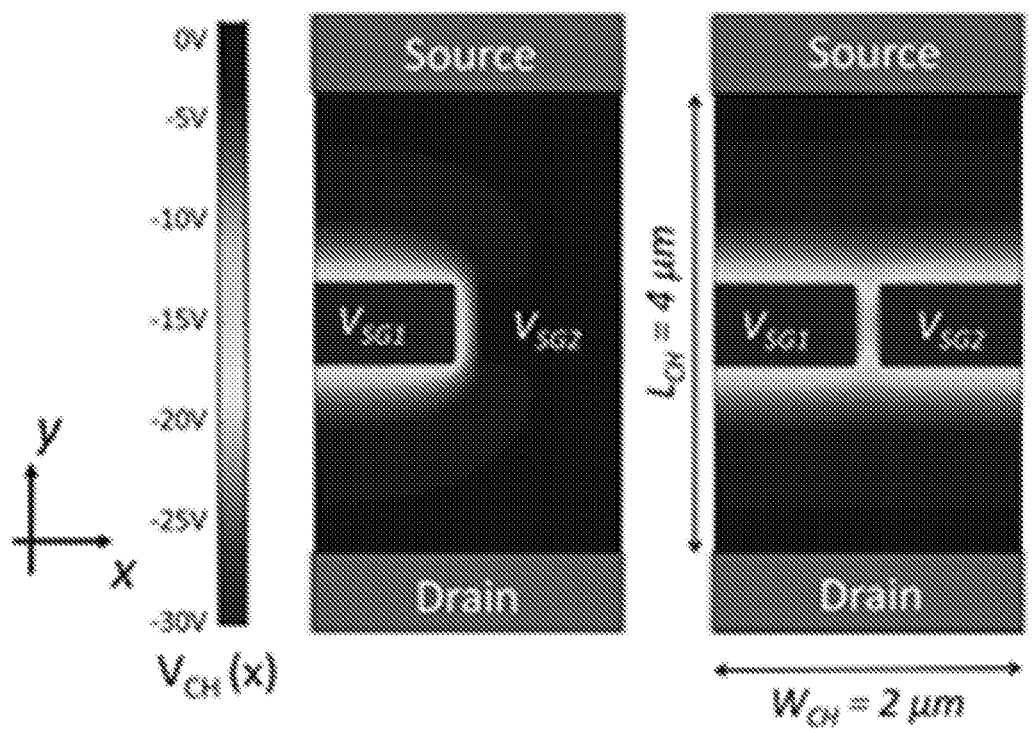
FIG. 12 shows a COMSOL multiphysics simulation of a 2D potential profile when −30V bias is applied to either one or both split-gates of the FET of FIG. 9.
Figure 13:
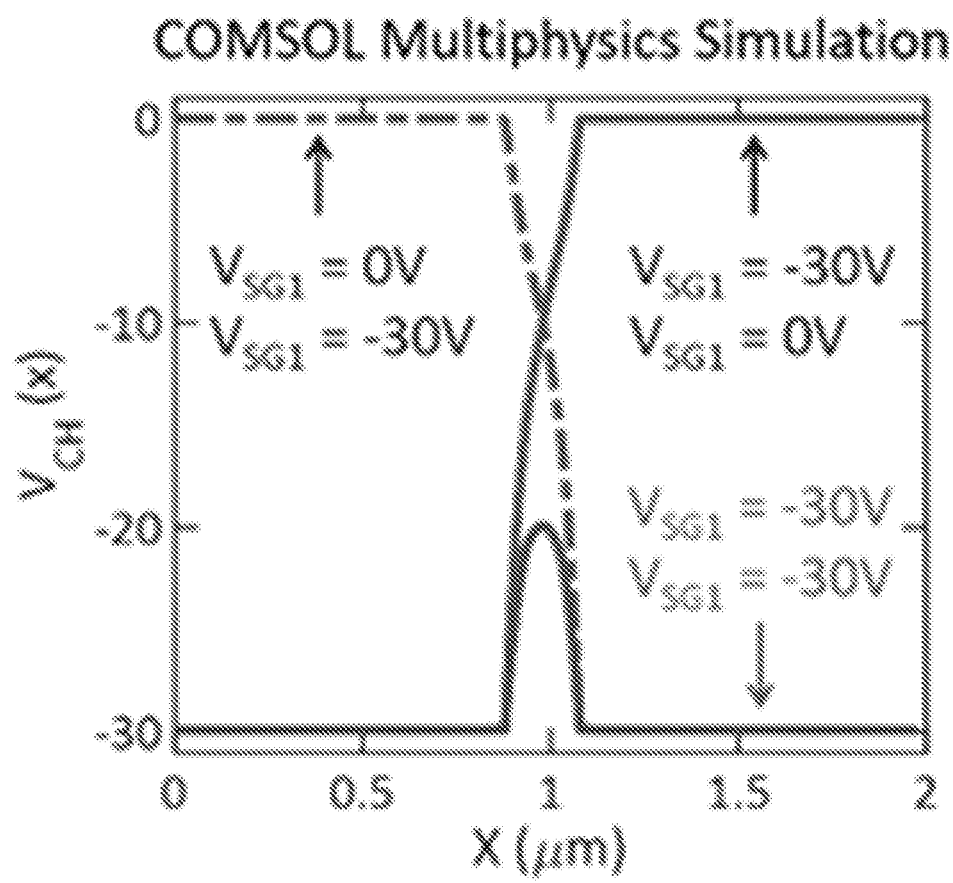
FIG. 13 shows the 1D potential profile along the channel width for different combinations of two split-gate biases.
Figure 14:
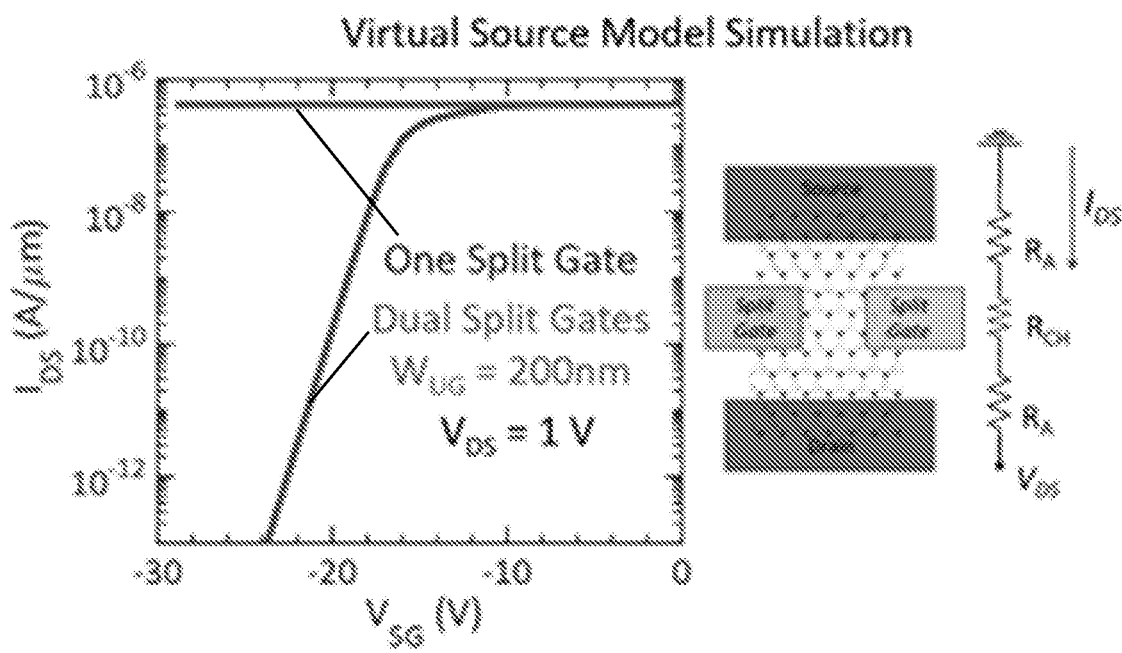
FIG. 14 shows the simulated transfer characteristics of the split-gated $MoS_2$ FET using the Virtual Source (VS) model and the electrostatic potential profile, $V_{CH}$ (X) along the channel width obtained from the COMSOL simulations.
Figure 15:
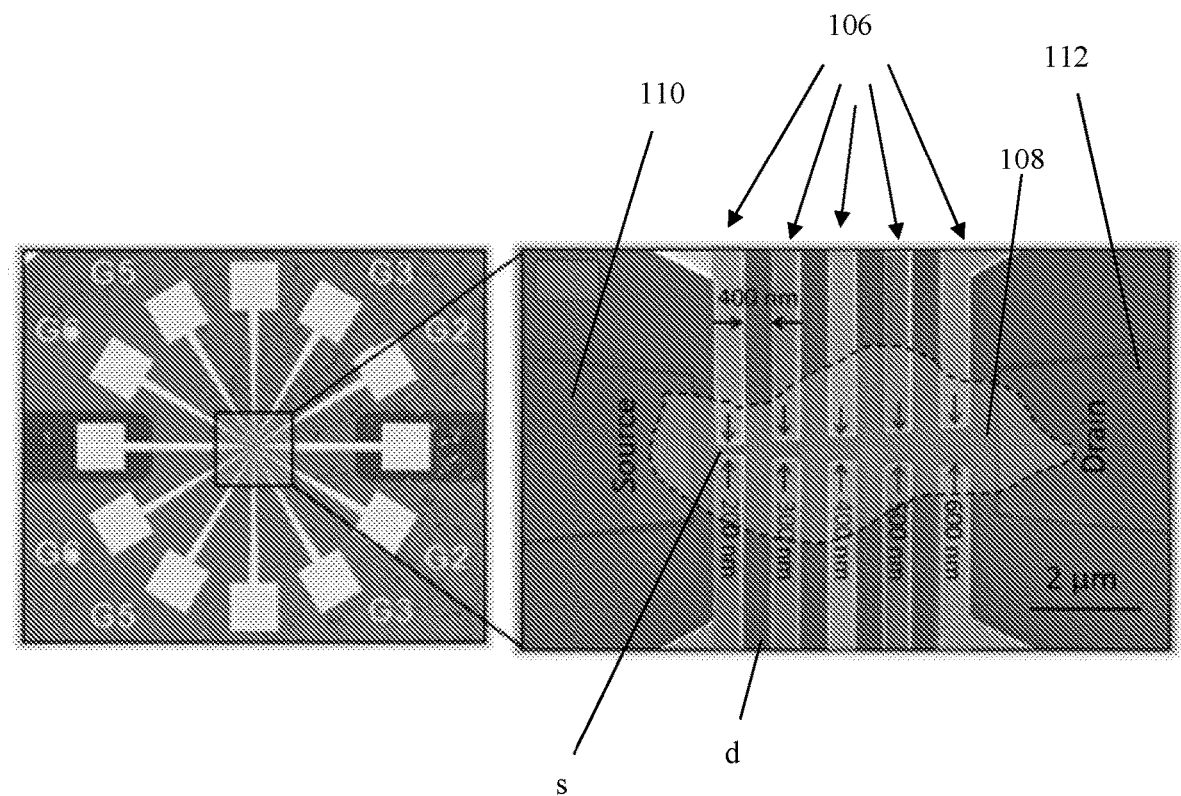
FIG. 15 shows the biomimetic audiomorphic device with a plurality of split gates.

FIG. 10A shows the transfer characteristics of the MoS$_2$ FET device 100—e.g., source to drain current ($I_{DS}$) versus split-gate voltage ($V_{SG}$) for a drain bias, $V_{DS}$=1V under two different conditions. One curve depicts the MoS$_2$ FET device 100 characteristics when one of the split-gates 106 is swept from 0V to -30V, while the other split-gate 106 is held at a constant bias of 0V. The other curve depicts the MoS$_2$ FET device 100 characteristics when both split-gates 106 are simultaneously swept from 0V to -30V. Unlike the fully top-gated case, $I_{DS}$ is relatively high when one of the split-gate 106 is at -30V. In other words, the MoS$_2$ FET device 100 cannot be turned OFF by one split-gate 106 and can be considered as always ON. However, when both split-gates 106 reach -30V simultaneously, the MoS$_2$ FET device 100 reaches OFF state with current ON/OFF ratio of ~10$^6$. Furthermore, the MoS$_2$ FET device 100 can be considered as a two-input-one-output digital element represented by the truth table shown in FIG. 10B, which can be identified as NAND logic. FIG. 11 shows that the output current from the MoS$_2$ FET device 100 is completely suppressed only when $V_{SG1}$ and $V_{SG2}$, of magnitude -30 V, arrive at the two corresponding spilt-gates 106, concurrently. FIG. 11 confirms that a split-gated MoS$_2$ FET device 100 can be used as a coincidence detector neuron.

n order to mimic the computational map constructed by the coincidence neurons in the auditory cortex of barn owl, the inventors fabricated a biomimetic audiomorphic device 104 structure shown in FIG. 15. FIG. 15 shows a FET device 100 with a plurality of split-gates 106. For instance, the FET device 100 can include a first split-gate 106, a second split-gate 106, a third split-gate 106, a fourth split-gate 106, and a fifth split-gate 106, each split-gate 106 having a first gate 106a and a second gate 106b architecture described above. The use of five split-gates 106 is exemplary, and it is understood that any number of split-gates 106 can be used. In an exemplary embodiment, the five split-gates 106 are distributed along a length of the channel 108, separated by spacing d. For instance, the spacing between the first split-gate 106 and the second split-gate 106 can be d$_1$. The spacing between the second split-gate 106 and the third split-gate 106 can be d$_2$. The spacing between the third split-gate 106 and the fourth split-gate 106 can be d$_3$. The spacing between the fourth split-gate 106 and the fifth split-gate 106 can be d$_4$. Any of d$_1$, d$_2$, d$_3$, d$_4$, can be equal to another or different. It is contemplated for each of d$_1$, d$_2$, d$_3$, d$_4$ to be equal to each other so as to have consistent or constant lateral spacing between each split-gate 106. The distance between the first gate 106a and the second gate 106b of each split-gate 106 can be s. Thus, the first split-gate 106 can have s$_1$, the second split-gate can have s$_2$, the third split-gate can have s$_3$, the fourth split-gate can have s$_4$, and the fifth split-gate can have s$_5$. Each of s$_1$, s$_2$, s$_3$, s$_4$, s$_5$ should be different from each other. It is contemplated for each of s$_5$>s$_4$, s$_4$>s$_3$, s$_3$>s$_2$, s$_2$>s$_1$ so as to monotonically increase s of each split-gate 106 from the source 110 to the drain 112. In an exemplary embodiment, each of d$_1$, d$_2$, d$_3$, d$_4$=400 nm, and s$_1$=200 nm, s$_2$=300 nm, s$_3$=400 nm, s$_4$=500 nm, and s$_5$=600 nm.

Figure 16:
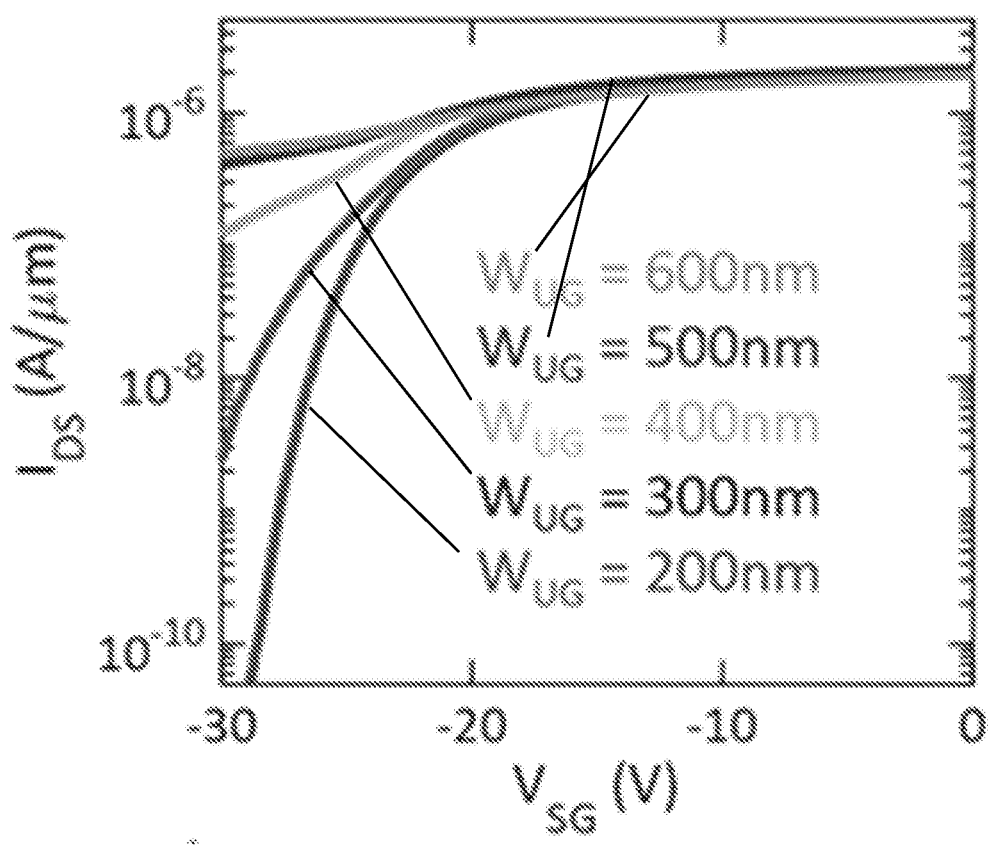
FIG. 16 shows the transfer characteristics of the device when each split gate of the FIG. 15 are concurrently swept from 0V to −30V.

FIG. 16 shows the transfer characteristics of the device when each of the five split-gates 106 are concurrently swept from 0V to -30V. Note that a split-gate 106 can, in principle, be constructed by combining any one of the first gates 106a with any other second gate 106b within the 10-gate structure. In fact there exists N(N+1)/2 distinct pairs of split-gates 106 in total which in the exemplary case is 15, since N=5. A parameter called inhibition ratio (IR) is defined as follows:

$$IR = \frac{I_{DS}(V_{SG} = 0 \text{ V})}{I_{DS}(V_{SG} = -30 \text{ V})} \qquad [1]$$

Figure 17:
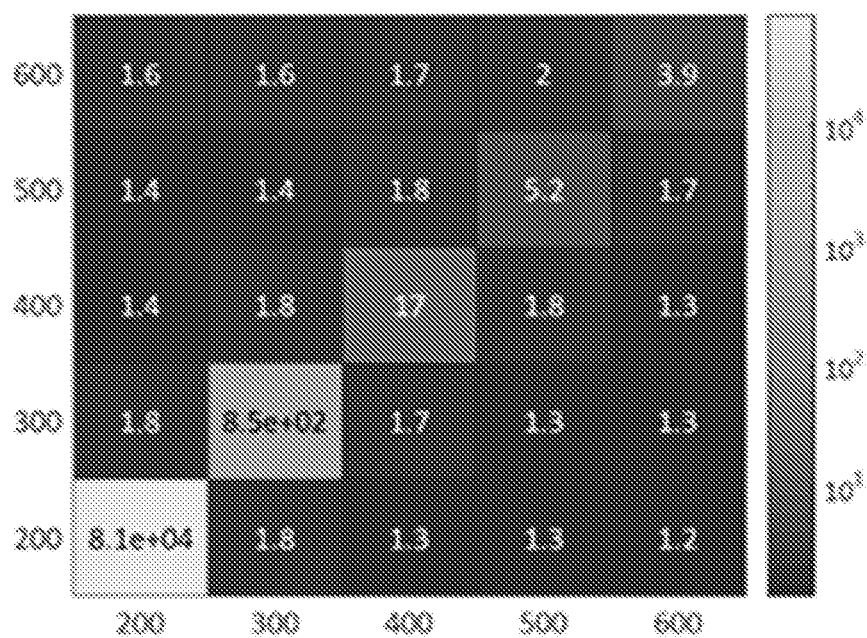
FIG. 17 shows the inhibition ratio (IR) color map for all possible combinations of the split-gates of the FIG. 15.
Figure 18:
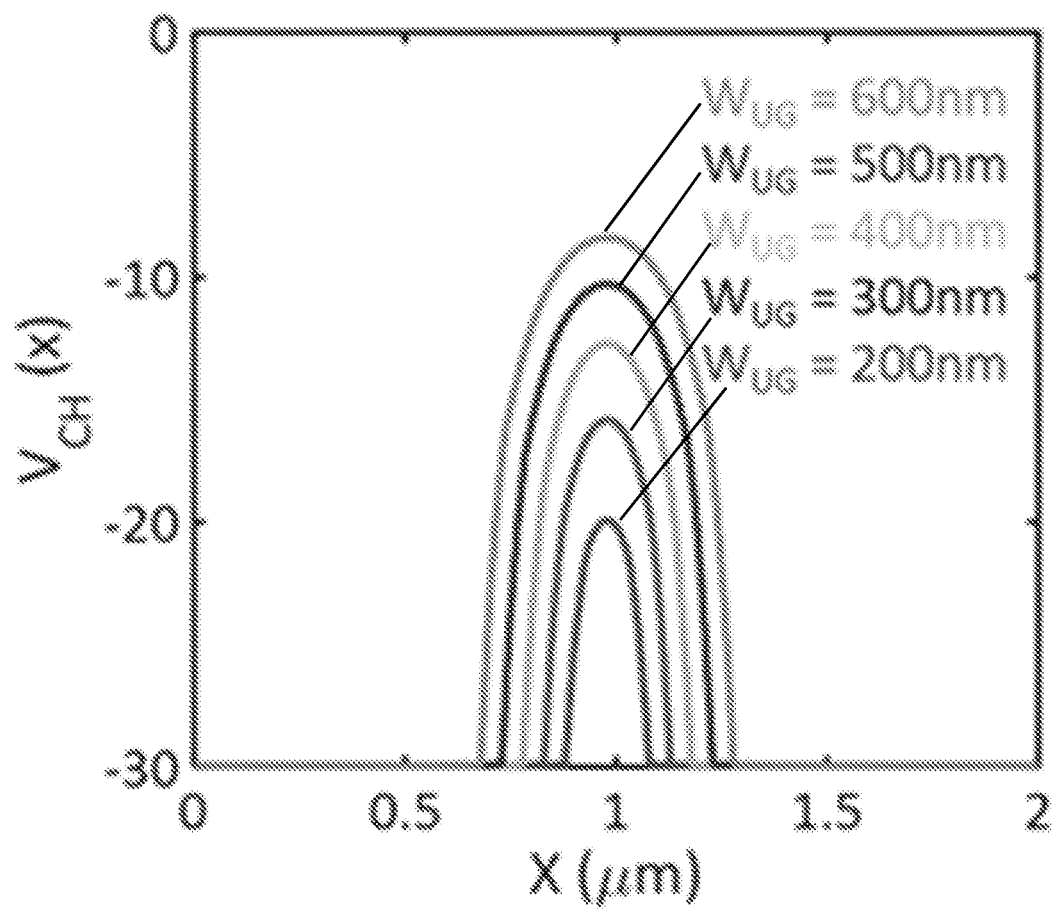
FIG. 18 shows the COMSOL simulation results for the 1D potential profile across the channel width for different split-gate spacing.

IR is the ratio of current through the FET device 100 corresponding to $V_{SG}$=0V and $V_{SG}$=-30V, concurrently applied to any given split-gate 106. FIG. 17 shows the IR color map for all possible combinations of the split-gates 106. Noticeably the IRs are significantly larger for split-gate pairs that are vertically aligned (diagonal elements in the color map). Being vertically aligned means that the first gate 106a and the second gate 106b are of the same split-gate 106. It is contemplated for these pairs to be used as individual coincidence detector neurons in the biomimetic audiomorphic device 104. Furthermore, within these vertically aligned pairs, the one with minimum split-gate spacing, s, has the maximum IR and vice versa. From the map, it is clear that the IR drops almost exponentially as a function of the split-gate spacing, s. This is interesting since the IR is mostly determined by the current that flows through the ungated region at $V_{SG}$=−30V. Note that at this $V_{SG}$, the gated regions are switched OFF. Although the electrostatic potential of the ungated region due to the split-gate potential diminishes linearly with the split-gate spacing, the exponential dependence in IR can be explained from the fact that the device is biased close to the subthreshold regime, where the device current is an exponential function of the channel potential. Note that the IR color map can be used to identify the split-gate pair where the coincidence took place, or in other words the device constructs a spatial map for the coincidence detection.

Figure 20:
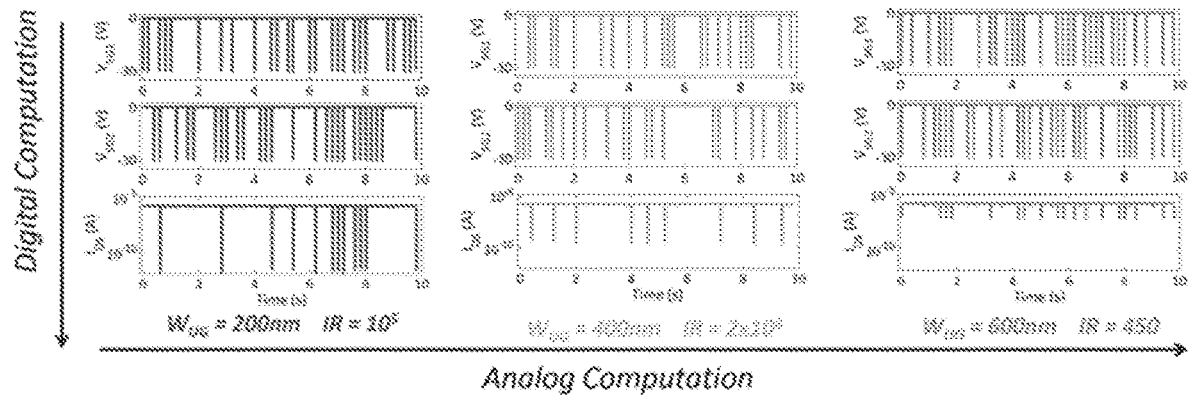
FIG. 20 shows the output current from an embodiment of the biomimetic audiomorphic device when random voltage spikes of magnitude −30 V are applied to two spilt gates corresponding to different spatial pairs.

FIG. 20 shows the output current from the FET device 100 when random voltage spikes of magnitude −30 V are applied to two spilt-gates 106 corresponding to different spatial pairs. All pairs detect coincidence by suppressing the device current. Furthermore, the suppression is maximum with an IR of ~$10^5$ when coincidence occurred in the split-gate pair corresponding to spacing, s=200 nm, and minimum with an IR of ~450 for spacing, s=600 nm. Clearly, individual split-gate pairs perform digital computation for coincidence detection (NAND logic), while, the FET device 100 as a whole uses analog IR values for determining the spatial location of the coincidence. As such, embodiments of the biomimetic audiomorphic device 104 using this FET device 100 can seamlessly combine digital and analog computation—a feature that is abundant in biological neural networks. It should be further noted that the number of split-gate pairs or coincidence neurons, $N_P$, determines the number of analog computation levels which in turn determines the angular precision, $\Delta\theta$, of the biomimetic audiomorphic device following the relationship, $\Delta\theta$=180°/$N_P$.

From this expression, it may appear that the angular precision can be made arbitrarily small by increasing the number of analog levels. However, a large number of analog levels would require a wider analog range for the current suppression or IR, or in other words it necessitates a semiconducting channel with large current ON/OFF ratio. If the minimum required difference between the analog IR values corresponding to two consecutive split-gate pairs is $\Delta IR_D$, then $N_P$ and hence $\Delta\theta$ will be determined by the following expression:

$$N_P = \frac{I_{ON}/I_{OFF}}{\Delta IR_D}; \Delta\theta = 180° \frac{\Delta IR_D}{I_{ON}/I_{OFF}} \quad [2]$$

Figure 19:
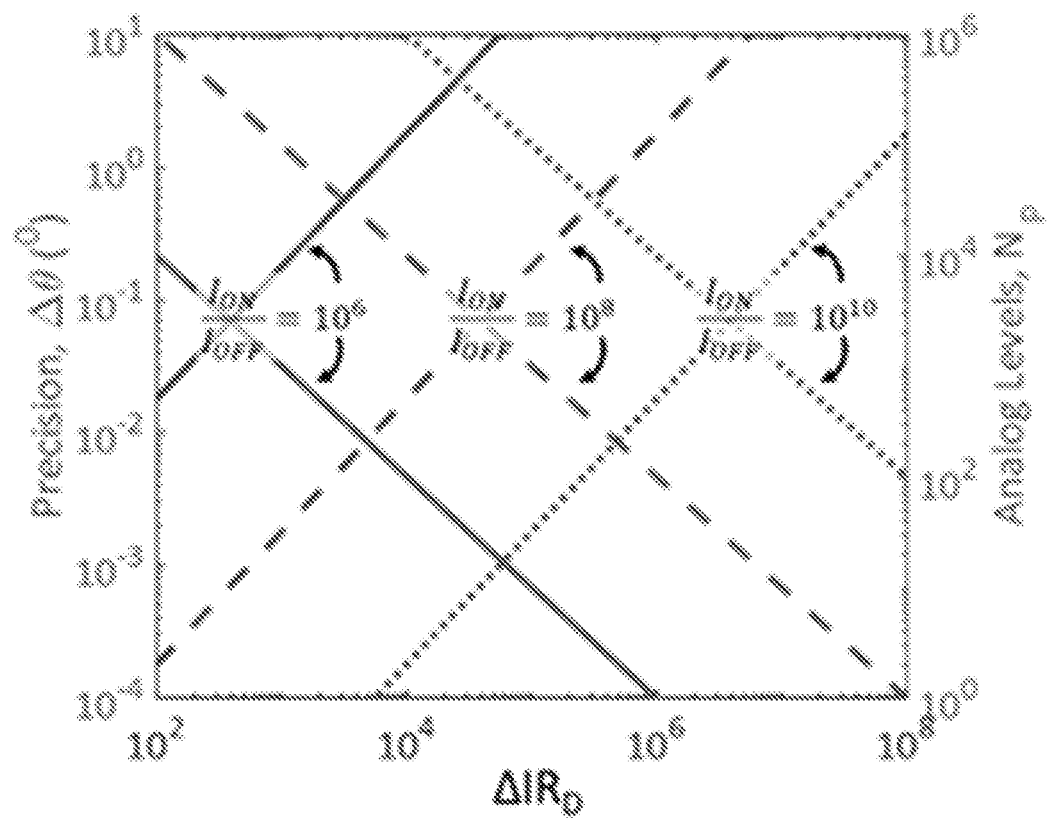
FIG. 19 shows the angular precision (Δθ) and number of analog levels ($N_P$) as a function of $ΔIR_D$ for different values of $I_{ON}/I_{OFF}$.

FIG. 19 shows $\Delta\theta$ and $N_P$ as a function of $\Delta IR_D$ for different values of $I_{ON}/I_{OFF}$. Note that a small value for $\Delta IR_D$ results in greater precision but also requires larger number of split-gate pairs. Furthermore, small $\Delta IR_D$ can be more susceptible to noise. Interestingly, the same precision can be achieved for a larger $\Delta IR_D$ by increasing the ON/OFF ratio. Nevertheless, the biomimetic audiomorphic device 104 can be designed to offer orders of magnitude better precision than the barn owl. The biomimetic audiomorphic device 104 also offers advantages in device footprint and scalability.

As described in the Jeffress model, the auditory cortex exploits the finite axonal conduction velocity for transforming the binaural acoustic information encoded via ITDs into a spatial computational map for sound localization. However, unlike the solid state electronic circuits where the signal propagation through metallic interconnects occur at a very high speed, axonal signal propagation is significantly slower. This is because the propagation of action potential along the length of an axon requires periodic charging of the leaky axoplasomic membrane. In vertebrate axons, the myelin sheath improves the axonal insulation and action potentials are regenerated only at the nodes of Ranvier through high density sodium ion-channels.

Figure 21:
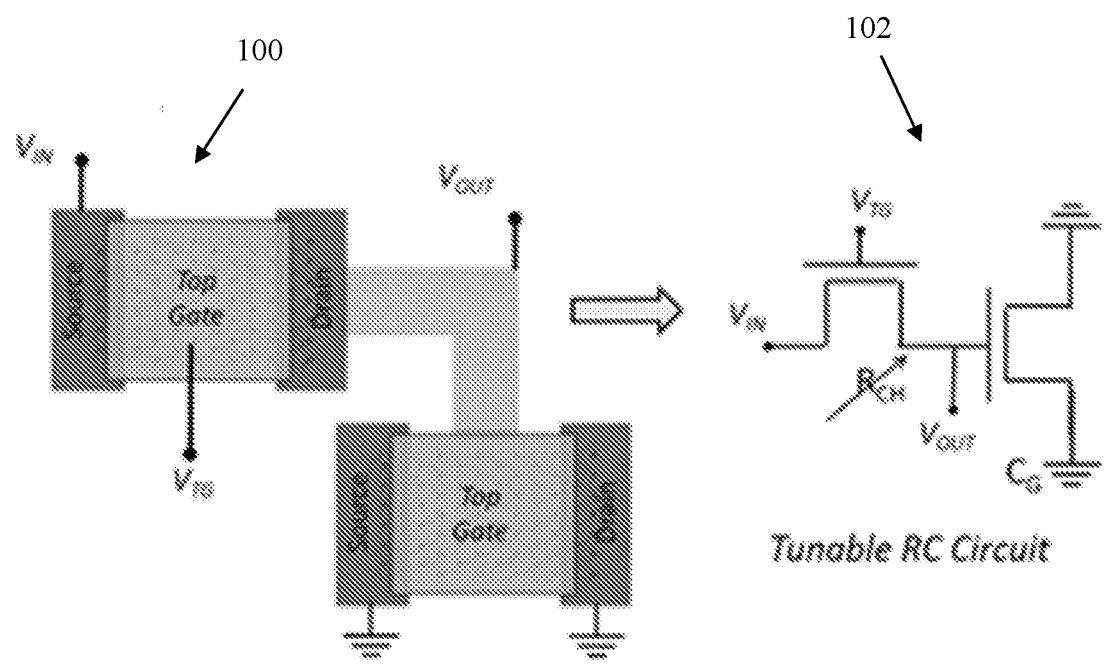
FIG. 21 shows the schematic of an artificial time delay neuron realized by connecting the gate of an embodiment of a split gate FET device to a drain of top-gated FET device.

FIG. 21 shows the schematic of an artificial time delay neuron realized by connecting the gate 106 of a first FET device 100 to a drain of a second FET device. The first FET device 100 is a split-gated FET device (FIG. 9) and the second FET device is a fully top-gated FET device (FIG. 7). This facilitates constructing a simple RC circuit 102 by the gate capacitance ($C_G$) and channel resistance ($R_{CH}$) of the corresponding FET device.

Figure 22:
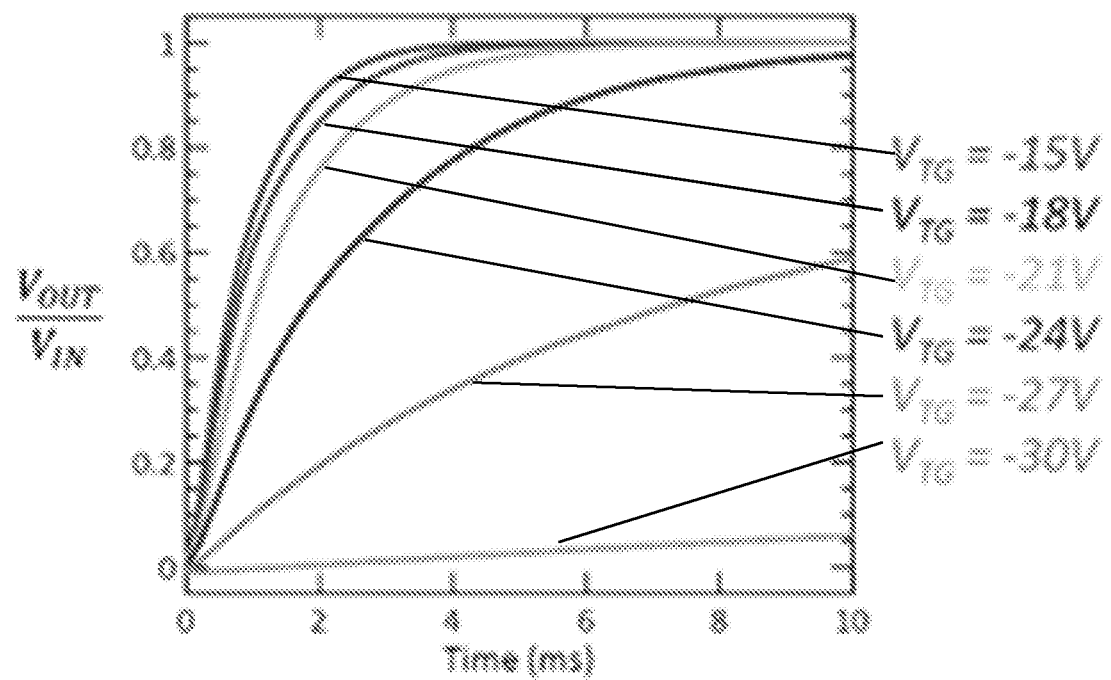
FIG. 22 shows the experimental transient responses of an embodiment of the artificial time delay neuron.

FIG. 22 shows the experimental transient responses of the artificial time delay neuron, which can be captured using equation 3:

$$V_{OUT} = V_{IN}\left[1 - \exp\left(-\frac{t}{R_{CH}C_G}\right)\right] = V_{IN}\left[1 - \exp\left(-\frac{t}{\tau_C}\right)\right] \quad [3]$$

Figure 23:
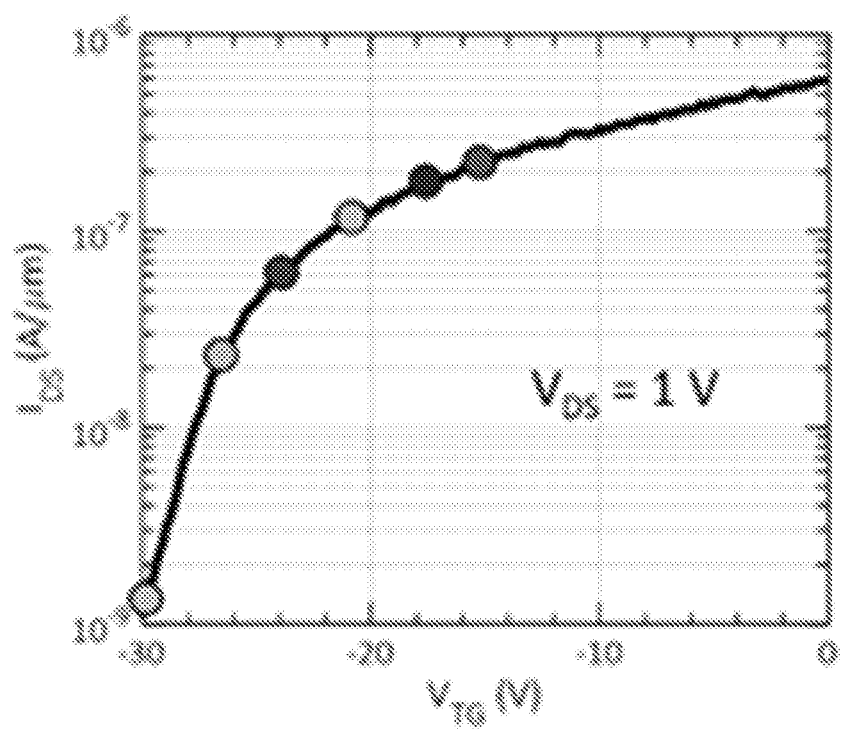
FIG. 23 shows transfer characteristics of a top-gated FET device at $V_{DS}$=1V.

In FIG. 22, the different transient responses correspond to different time constants or delays ($\tau_C$) achieved by biasing the resistive FET device (the fully top-gated FET device) in different regimes of operations as shown FIG. 23. The time constant was found to vary from ~800 μs at $V_{TG}$=−15V to ~200 ms at $V_{TG}$=−30V corresponding to $R_{CH}$ values varying from 4.4 MΩ to 0.9 GΩ, respectively. The gate capacitance due to large gate metal pads and other parasitic contributions was 180±20 pF. The time constant can be reduced by reducing the $R_{CH}$ by biasing the FET device further into the ON-state.

Figure 24A:
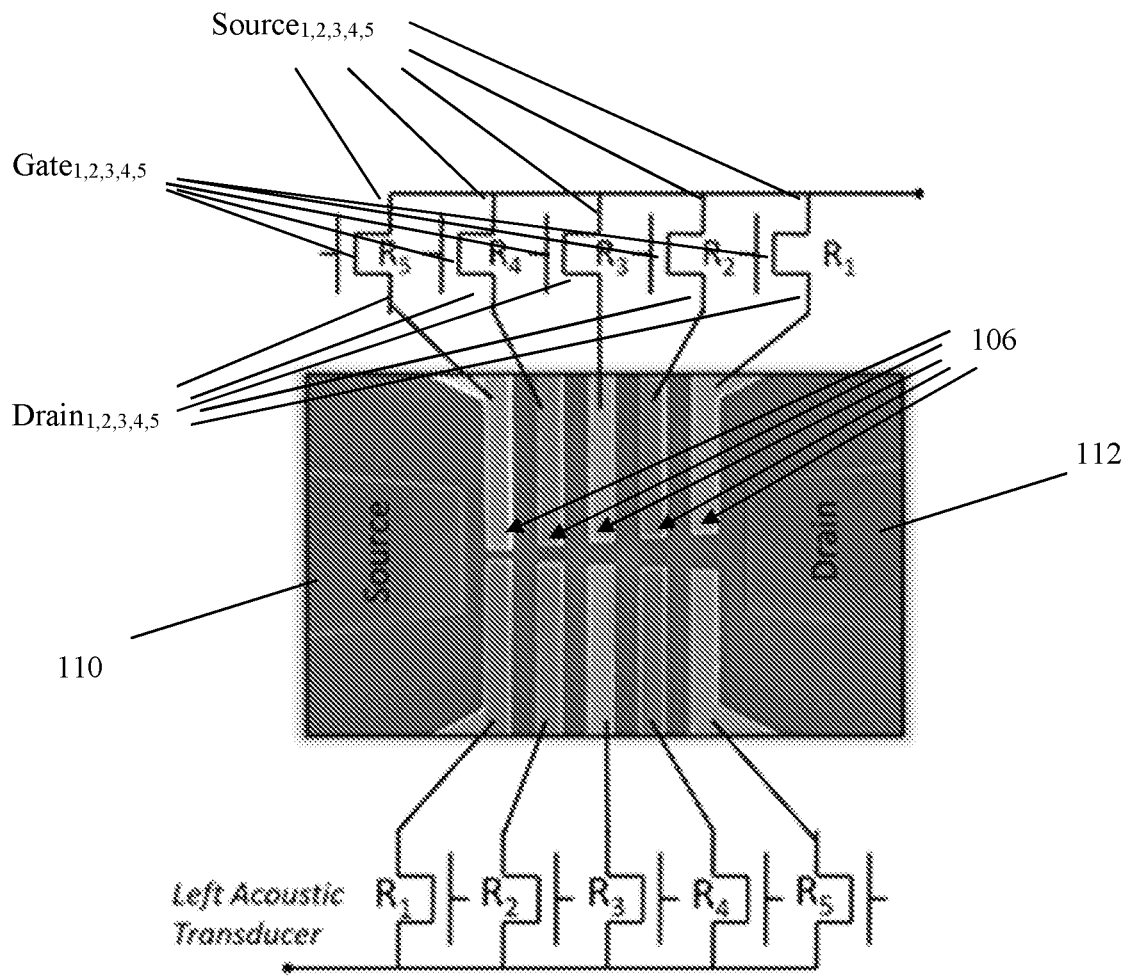
FIGS. 24A and 24B show an embodiment of the biomimetic audiomorphic device integrating the split-gate FET device architecture and an RC circuit architecture.
Figure 24B:
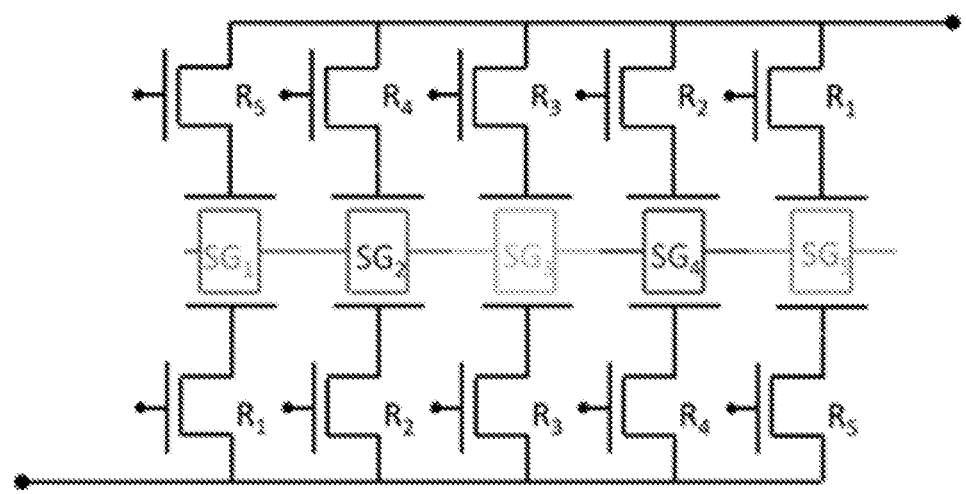

FIG. 24 shows an embodiment of the biomimetic audiomorphic device 104 using embodiments of the FET device 100 and RC circuit architectures. The biomimetic audiomorphic device 104 includes a FET device 100 (having a split gate architecture) in which each split-gate 106 is connected to the drain of a corresponding fully top-gated FET device. For instance, the first split-gate 106 is connected to the drain of a first fully top-gated FET device (having a $source_1$, $drain_1$, and $gate_1$), the second split-gate 106 is connected to the drain of a second fully top-gated FET (having a $source_2$, $drain_2$, and $gate_2$), the third split-gate 106 is connected to the drain of a third fully top-gated FET device (having a $source_3$, $drain_3$, and $gate_3$), the fourth split-gate 106 is connected to the drain of a fourth fully top-gated FET device (having a $source_4$, $drain_4$, and $gate_4$), and the fifth split-gate 106 is connected to the drain of a fifth fully top-gated FET device (having a $source_5$, $drain_5$, and $gate_5$). Thus, the first split-gate 106 can have its first gate 106a and its second gate 106b connected to $drain_5$ and $drain_1$ of the first fully top-gated FET device on either side, respectively. The second split-gate 106 can have its first gate 106a and its second gate 106b connected to $drain_4$ and $drain_2$ of the second fully top-gated FET device on either side, respectively. The third split-gate 106 can have its first gate 106a and its second gate 106b connected to $drain_3$ and $drain_3$ of the third fully top-gated FET device on either side, respectively. The fourth split-gate 106 can have its first gate 106a and its second gate 106b connected to $drain_4$ and $drain_2$ of the fourth fully top-gated FET device on either side, respectively. The fifth split-gate 106 can have its first gate 106a and its second gate 106b connected to $drain_5$ and $drain_1$ of the fifth fully top-gated FET device on either side, respectively. Each of $source_1$, $source_2$, $source_3$, $source_4$, $source_5$ of the first, second, third, fourth, and fifth fully top-gates FETs can be connected to each other at a node.

Note that the resistances of the fully top-gated FET devices connected to the bottom halves of the split-gates increase monotonically from left to right and vice versa for the top halves of the split-gates. Thus, in the exemplary embodiment in which $s_5>s_4$, $s_4>s_3$, $s_3>s_2$, $s_2>s_1$, the first fully top-gated FET device has a resistance of $R_1$, the second fully top-gated FET device has a resistance of $R_2$, the third fully top-gated FET device has a resistance of $R_3$, the fourth fully top-gated FET device has a resistance of $R_4$, and the fifth fully top-gated FET device has a resistance of $R_5$, wherein $R_5>R_4$, $R_4>R_3$, $R_3>R_2$, $R_2>R_1$ for the top halves of the split-gates and vice versa for the bottom halves. This facilitates imitating the organization of delay axons in the auditory cortex of the barn owl. The required resistance values can be achieved by designing the length and width of the fully top-gated FET devices accordingly.

One of the remarkable features of the brain is its plasticity. For example barn owls survive by hunting small rodents in the open countryside in Europe. However, there is a significant change in the ground cover available to its prey species between winter and summer. The barn owl must, therefore, become more precise and alert in sound localization in winter than in summer by reversibly changing its brain morphology. Brain morphology can also change due to adaptation to the local environment. For example, the precision in sound localization differs between the barn owls found in the Mediterranean versus Europe or North America. Therefore, it may be desirable to introduce neuroplasticity into the biomimetic audiomorphic device 104.

Figure 25:
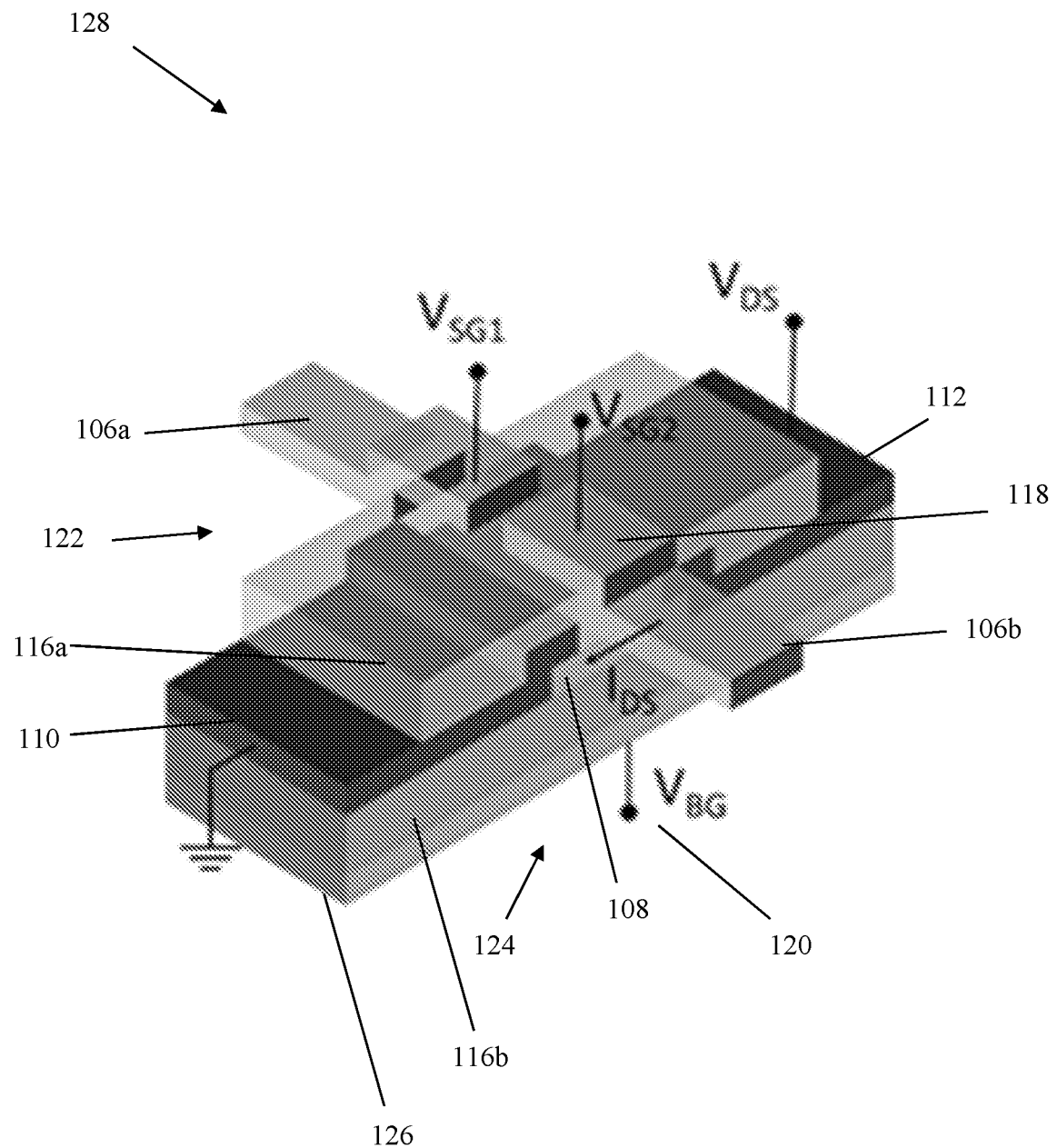
FIG. 25 shows an exemplary schematic of a FET device with global back-gating capability.

FIG. 25 shows an exemplary schematic of a FET device 128 with global back-gating capability. This is achieved by including a back-gate dielectric to form a heavily doped back-gate 120 or back-gate electrode. A top oxide layer 116 is formed in and/or on at least a portion of the source 110. The top oxide layer 116a is formed on the top surface and is formed in and/or on at least a portion of the drain 112. In some embodiments, the top oxide layer 116 (e.g., HSQ, $Al_2O_3$, $HfO_2$, h-BN) spans a length between the source 110 and the drain 112. The bottom surface of the substrate 114 includes a bottom oxide layer 116b. The bottom oxide layer 116b can be $SiO_2$, but other materials can be used such as $Al_2O_3$, $HfO_2$, h-BN, etc. In some embodiments, the bottom surface of the bottom oxide layer 116b includes a polycrystalline silicon layer 126. The bottom oxide layer 116b and the polycrystalline layer 126 form the back-gate 120. In the exemplary FET device 128, the back-gate dielectric is 285 nm of $SiO_2$ and the back-gate electrode 126 is heavily doped Si.

FET device 128 is configured to have a split gate architecture similar to the embodiment described in the FIG. 9 example. The split-gate 106 includes a first gate 106a formed between the source 110, the drain 112, and a $MoS_2$ semiconducting material 108 on a first side 122 of the FET device 128. The split-gate 106 includes a second gate 106b formed between the source 110, the drain 112, and a $MoS_2$ semiconducting material 108 on a second side 124 of the FET device 128. The first gate 106a is physically separated from the second gate 106b. The top oxide layer 116a is be formed in and/or on at least a portion of the source 110 and at least a portion of the drain 112 so as to span a length between the source 110 and the drain 112. The semiconducting region $MoS_2$ 108 which is underneath the oxide layer 116a is the active region of operation and lies between source 110 and drain 112. A metallic layer 118 is formed on top of the top oxide layer 116a, wherein the metallic layer 118 and the top oxide layer 116a form the split-gate 106. In this configuration, the source 110 may be connected to ground so that in operation, the drain 112 is biased at a drain-source voltage $V_{DS}$, the first gate 106a is biased at a split-gate voltage $V_{SG1}$, the second gate 106b is biased at a split-gate voltage $V_{SG2}$, a drain-source current $I_{DS}$ flows through the channel 108, and the back-gate 120 is biased at a back-gate voltage $V_{BG}$. The source 110 and drain 112 voltages are biased at 0 and 1V respectively and the current $I_{DS}$ flows from drain to source. The split gates $V_{SG1}$ 106a and $V_{SG2}$ 106b correspondingly modulate the drain to source current when biases are applied. The back-gate voltages ($V_{BG}$) is used to modulate the conductivity of the channel.

Figure 26:
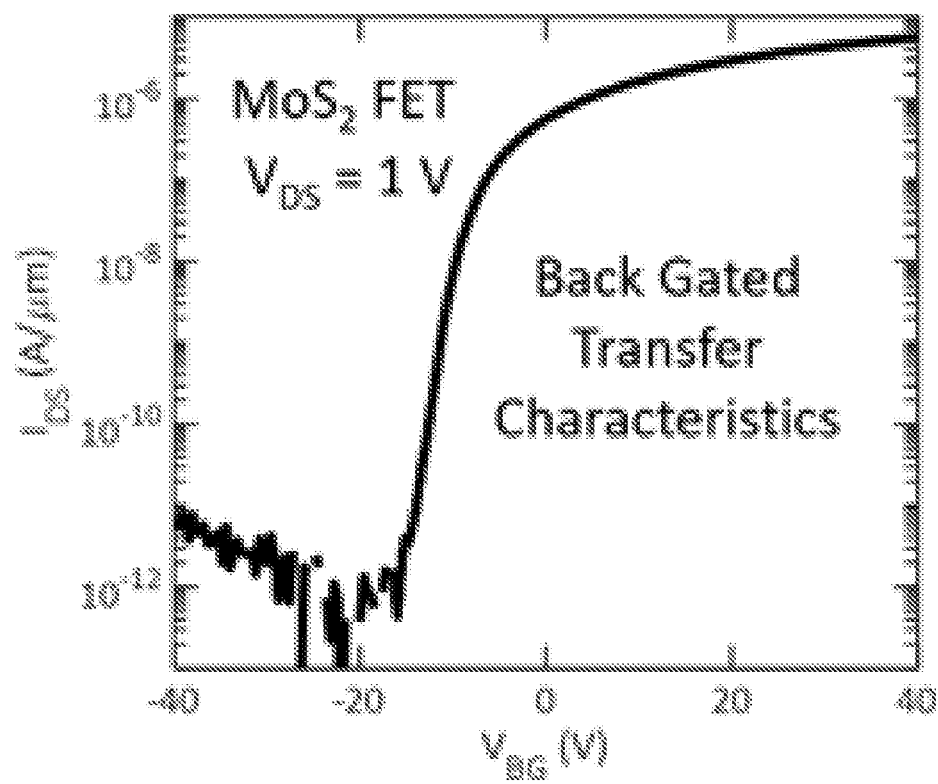
FIG. 26 shows the back-gate transfer characteristics for $V_{DS}$=1V.

FIG. 26 shows the back-gate 120 transfer characteristics for $V_{DS}$=1V. The back-gate 120 has full electrostatic control over the entire channel, which is reflected in the large current ON/OFF ratio of $10^6$. The back-gate 120 threshold voltage was found to be $V_{TB}$=−12V.

Figure 27:
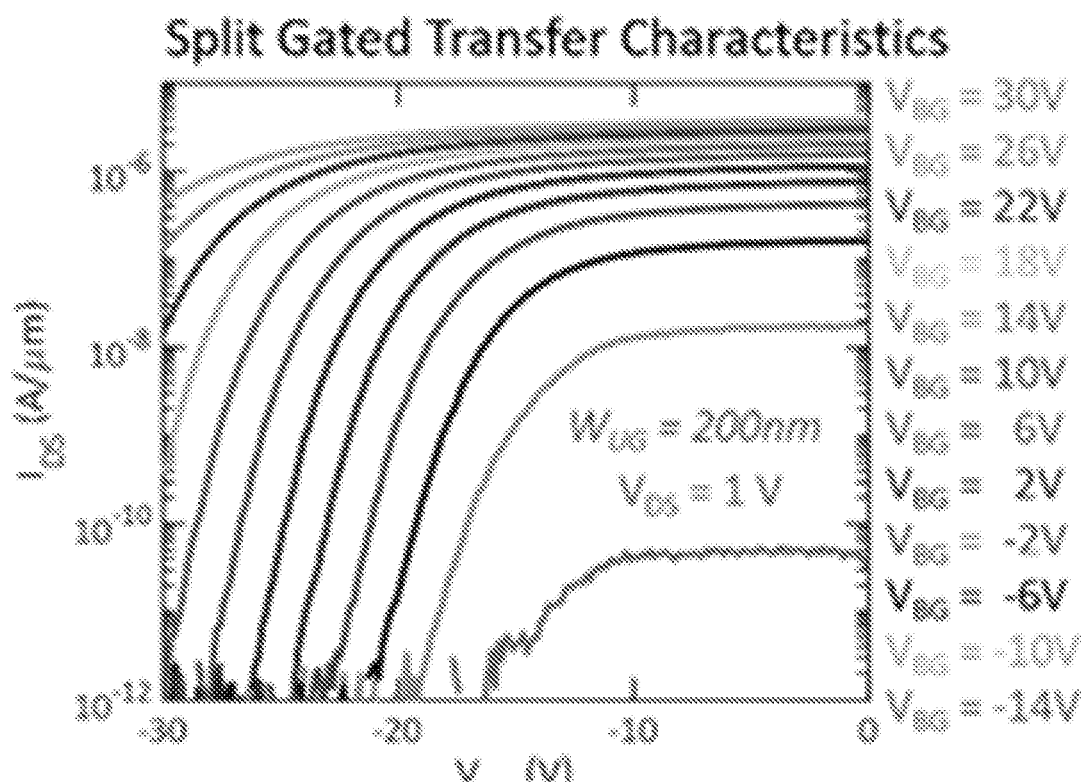
FIG. 27 shows the transfer characteristics of an embodiment of the biomimetic device when the split-gate pair are concurrently swept from 0V to −30V under different back-gate ($V_{BG}$) biases.
Figure 28:
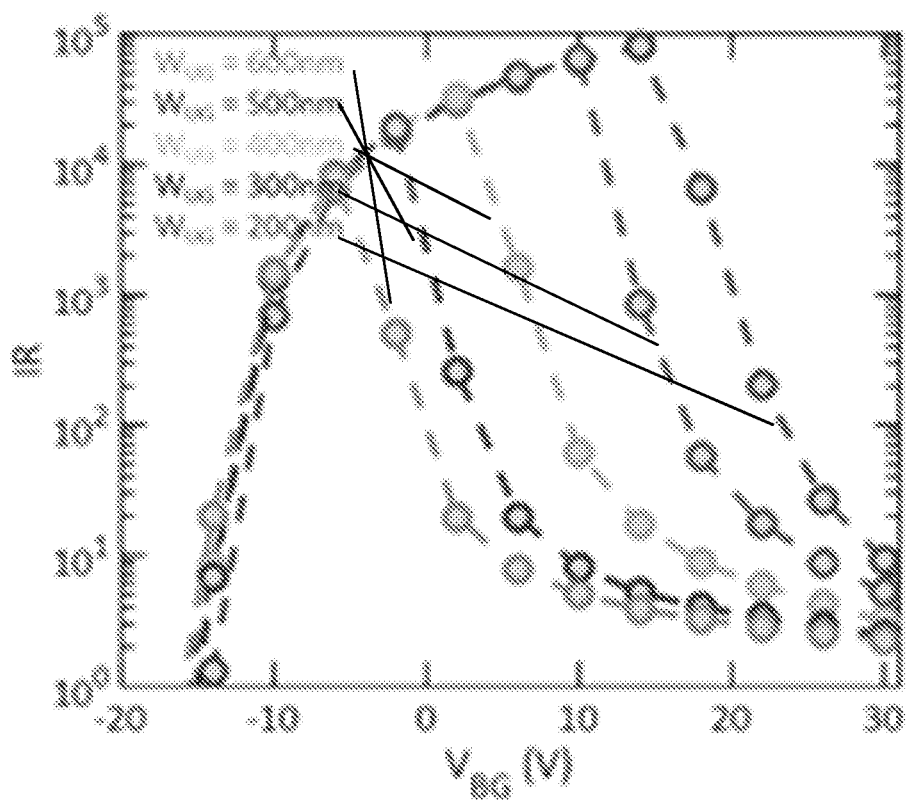
FIG. 28 shows the inhibition ratio (IR) as a function of $V_{BG}$ for different split-gate spacing extracted from the corresponding transfer characteristics.

FIG. 27 shows the transfer characteristics of the FET device 128 when the split-gate pair with 200 nm spacing is concurrently swept from 0V to −30V under different back-gate 120 ($V_{BG}$) biases. Clearly, the inhibition ratio (IR) changes significantly and non-monotonically as a function of $V_{BG}$ as shown in FIG. 28. This can be explained from the fact that when, $V_{BG}>>V_{TB}$, the FET device 128 is in the deep ON-state and hence the current through the ungated region remains high even for $V_{SG}$=−30V resulting in low IR. As $V_{BG}$ approaches $V_{TB}$, but still remains above threshold, the current through the device for $V_{SG}$=0V only reduces linearly. However, now it becomes relatively easier for the split-gates to switch the ungated channel region from ON state to subthreshold and reduce the device current exponentially for $V_{SG}$=−30V resulting in an increased IR. Once $V_{BG}$ goes below $V_{TB}$, the entire device enters subthreshold operation. Now the current through the device for $V_{SG}$=0V also reduces exponentially resulting in a decrease in IR. Finally, for $V_{BG}<<V_{TB}$, the entire device is in the deep subthreshold regime with current levels beyond the detection limits of the measurement apparatus and as such the effect of $V_{SG}$ becomes inconsequential.

FIG. 28 shows the IR as a function of $V_{BG}$ for different split-gate pairs. The non-monotonic trend is observed for all split-gate pairs, however, the $V_{BG}$ value for which a given split-gate pair achieves maximum inhibition ratio decreases monotonically as the split-gate spacing increases. This is expected since larger split-gate spacing translates into weaker split-gate control of the ungated region and hence it requires significant electrostatic aid from the back-gate 120. In other words, the back-gate bias should be close to the back-gate threshold so that the impact of the split-gate pair is stronger in the ungated region. In a dual-gated FET, the coupling between the top/split-gate and the back-gate is critical in understanding the impact of one on the other.

Figure 29:
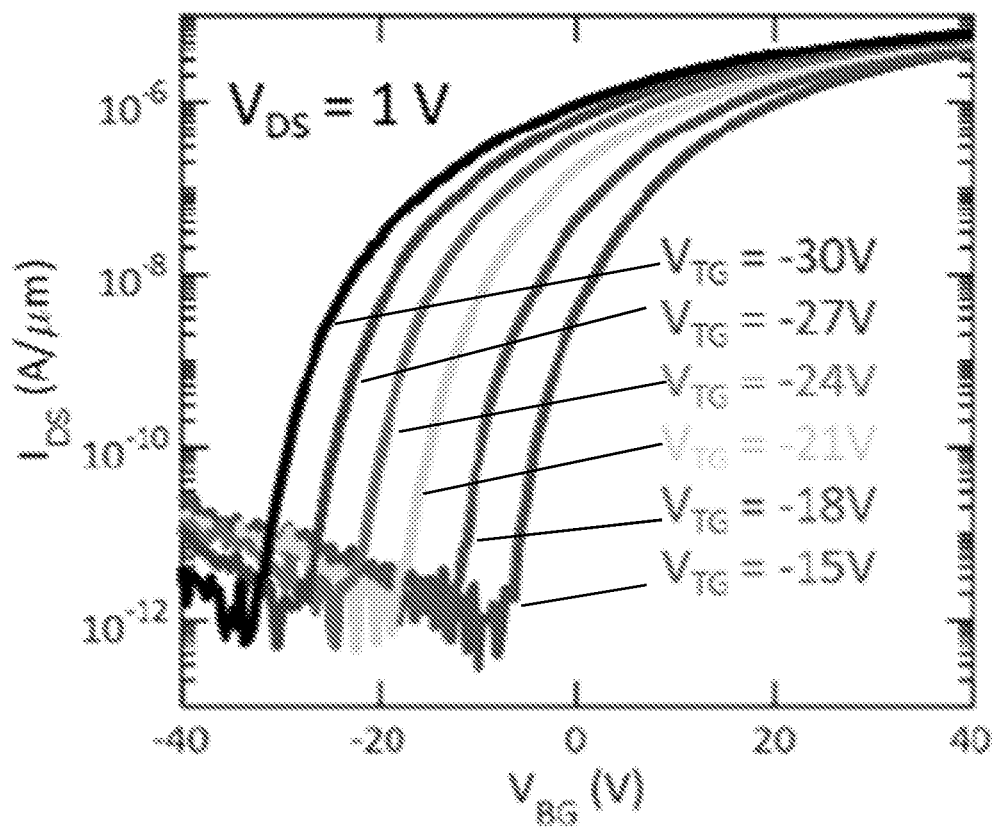
FIG. 29 shows the back-gate transfer characteristics of a fully top-gated $MoS_2$ FET for different top-gate voltages ($V_{TG}$) at $V_{DS}$=1V.

FIG. 29 shows the back-gate transfer characteristics of a fully top-gated $MoS_2$ FET for different top-gate voltages ($V_{TG}$) at $V_{DS}$=1V. Clearly, the back-gate threshold voltage, $V_{TB}$, depends on $V_{TG}$, which can be explained form the principle of charge balance, i.e. the inversion charge induced by the top-gate must be compensated by the back-gate and vice versa.

Figure 30:
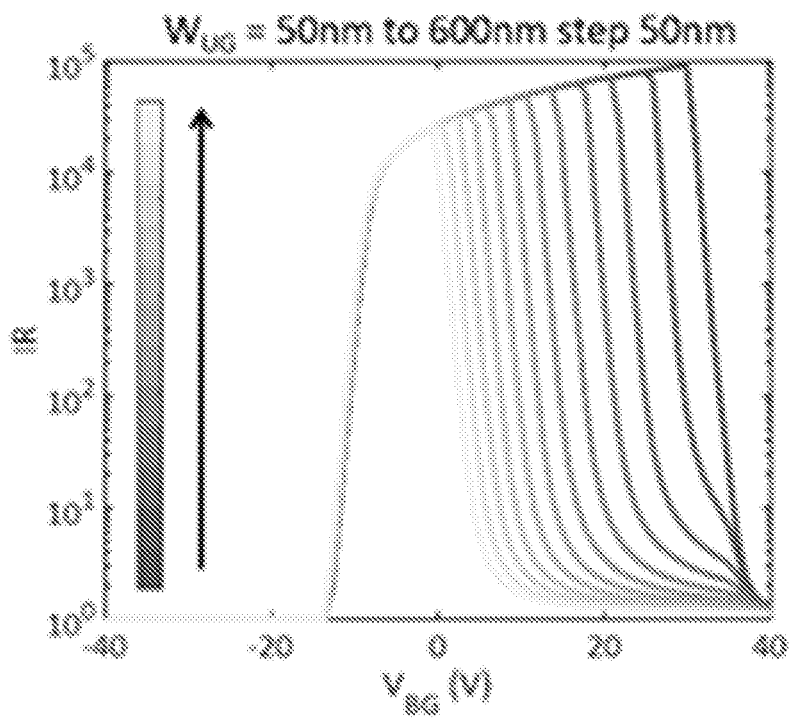
FIG. 30 shows the extracted IR from the VS model simulation results as a function of $V_{BG}$ for various split-gate spacing ranging from 50 nm to 600 nm.

FIG. 30 shows the extracted IR from the VS model simulation results as a function of $V_{BG}$ for various split-gate spacing ranging from 50 nm to 600 nm. To mimic the experimental conditions, the minimum OFF current through the device was restricted to 50 pA/µm corresponding to the leakage floor of the measurement instrument. Clearly, the simulated split-gate transfer characteristics and the IR plots show remarkable similarity with the experimental results. Therefore, it can be concluded that the back-gate bias can be used to tune the IR by orders of magnitude and hence can be used to imitate neuroplasticity.

Figure 31:
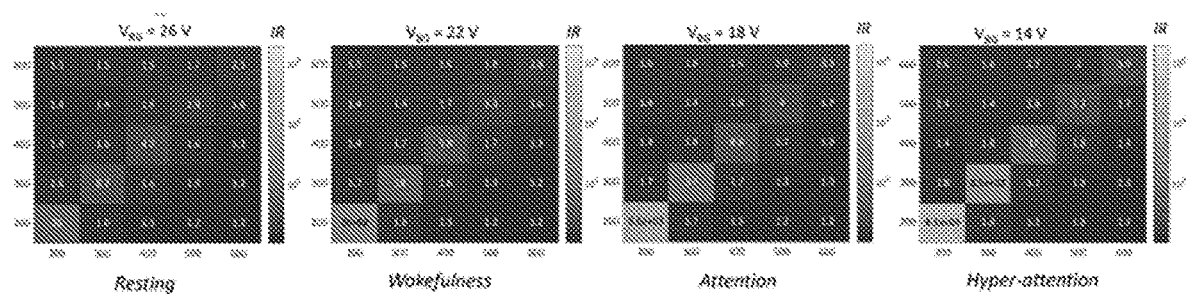
FIG. 31 shows the color map of IR for all possible split-gate pairs of our biomimetic device under different back-gate biases.

FIG. 31 shows the color map of IR for all possible split-gate pairs of our biomimetic device under different back-gate biases. Note that a large difference in the magnitude of IR among the diagonal elements is desirable for easier detection of the location of coincidence and hence the localization of the sound source. Clearly, $V_{BG}=14$ V provides the maximum IR contrast and hence the corresponding color map can be related to the hyper-attentive state of the barn owl. As expected, the IR contrasts in the color maps diminish monotonically as $V_{BG}$ becomes more positive i.e. the device is biased in the deep ON-state. Therefore, the IR color maps corresponding to $V_{BG}=18$ V, 22 V and 26 V can be correlated to the attentive, wakeful and resting state of the barn owl, respectively.

In the conclusion, the inventors have successfully demonstrated the biomimicry of the neural computational algorithm in the auditory cortex of barn owl. The inventors developed a biomimetic audiomorphic device 104 using multiple split-gates on a single semiconducting $MoS_2$ channel connected to source/drain contacts for emulating the spatial map of coincidence detector neurons and tunable RC circuits for imitating the time delay neurons following the Jeffress model of sound localization. One of the unique features of this biomimetic audiomorphic device 104 is the fact that it seamlessly combines digital and analog computation, which is abundant in biological neural networks. In short, individual split-gate pairs perform digital computation using NAND logic for determining spiking coincidence, while the biomimetic audiomorphic device 104 as a whole uses analog values for the inhibition ratio (IR) to determine the spatial location of the coincidence. Further, artificial time delay neurons realized using the semiconducting channel resistance and gate capacitance of $MoS_2$ FETs allow biomimicking of finite axonal conduction velocity, which is essential for translating the ITDs into a spatial computational map. In addition, global back-gating capability adds tunable and reversible neuroplasticity to the biomimetic audiomorphic device 104.

It should be understood that the disclosure of a range of values is a disclosure of every numerical value within that range, including the end points. It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be apparent to those skilled in the art that numerous modifications and variations of the described examples and embodiments are possible considering the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof.

It should be understood that modifications to the embodiments disclosed herein can be made to meet a particular set of design criteria. Therefore, while certain exemplary embodiments of the device and methods of using and making the same disclosed herein have been discussed and illustrated, it is to be distinctly understood that the invention is not limited thereto but may be otherwise variously embodied and practiced within the scope of the following claims.

What is claimed is:

1. A biomimetic audiomorphic device, comprising:
a substrate to serve as a back-gate;
an insulator or oxide layer formed on the substrate to serve as a back-gate dielectric;
a semiconducting channel formed on the back-gate dielectric layer;
metallic layers formed in and/or on the semiconducting channel to define a source contact and a drain contact;
an insulator or oxide layer to serve as a top-gate dielectric; and
a metallic layer formed on the top-gate dielectric to define a split-gate pair, the split-gate pair comprising a first gate and a second gate;
wherein the metallic layer formed on the top-gate dielectric defines a plurality of split-gate pairs.

2. The device of claim 1, wherein:
the first gate is formed between the source contact and the drain contact located on a first side of the device;
the second gate is formed between the source contact and the drain contact on a second side of the device; and
the first gate is physically separated from the second gate.

3. The device of claim 1, wherein the substrate is Si.

4. The device of claim 1, wherein the back-gate oxide layer is selected from the group consisting of $SiO_2$, $Al_2O_3$, $HfO_2$, or h-BN.

5. The device of claim 1, wherein the semiconducting channel is an organic semiconductor material or an inorganic semiconductor material.

6. The device of claim 1, wherein the metallic layer formed on the top-gate dielectric is a stack of nickel or gold.

7. The device of claim 1, wherein the top-gate oxide layer is selected from the group consisting of Hydrogen silsesquioxane (HSQ), $Al_2O_3$, $HfO_2$, or h-BN.

8. The device of claim 1, wherein, in operation:
the back-gate is biased at a voltage $V_{BG}$, the source contact is grounded, and the drain contact is biased at a drain-to-source voltage $V_{DS}$; and
the first split-gate is biased at a split-gate voltage $V_{SG1}$, the second split-gate is biased at a split-gate voltage $V_{SG2}$, and a source-to-drain current IDS flows through the semiconducting channel.

9. The device of claim 1, wherein the plurality of split-gate pairs includes a first split-gate pair, a second split-gate pair, a third split-gate pair, a fourth split-gate pair, and a fifth split-gate pair.

10. The device of claim 9, wherein each split-gate pair is separated by a distance, d, and:
the distance between the first split-gate pair and the second split-gate pair is $d_1$;
the distance between the second split-gate pair and the third split-gate pair is $d_2$;
the distance between the third split-gate pair and the fourth split-gate pair is $d_3$;
the distance between the fourth split-gate pair and the fifth split-gate pair is $d_4$; and
either $d_1$, $d_2$, $d_3$, $d_4$ are equal to each other, or $d_1$, $d_2$, $d_3$, $d_4$ are unequal to each other.

11. The device of claim 9, wherein each first gate and second gate of each split gate pair is separated by a distance, s, and:

the distance between the first gate and the second gate of the first split-gate pair is $s_1$;

the distance between the first gate and the second gate of the second split-gate pair is $s_2$;

the distance between the first gate and the second gate of the third split-gate pair is $s_3$;

the distance between the first gate and the second gate of the fourth split-gate pair is $s_4$;

the distance between the first gate and the second gate of the fifth split-gate pair is $s_5$; and $s_5 > s_4$, $s_4 > s_3$, $s_3 > s_2$, and $s_2 > s_1$.

12. The device of claim 1, wherein each first gate and second gate of each split gate pair is separated by a distance, s, and the s for one split gate pair is different from the s for another split gate pair.

13. A biomimetic audiomorphic device, comprising:
a substrate to serve as a back-gate;
an insulator or oxide layer formed on the substrate to serve as a back-gate dielectric;
a semiconducting channel formed on the back-gate dielectric layer;
metallic layers formed in and/or on the semiconducting channel to define a source contact and a drain contact;
an insulator or oxide layer to serve as a top-gate dielectric;
a metallic layer formed on the top-gate dielectric to define a split-gate pair, the split-gate pair comprising a first gate and a second gate; and
a plurality of fullytop-gated field effect transistor (FET) devices or resistors.

14. A fullytop-gated field effect transistor (FET) device, comprises:
a substrate to serve as a back-gate;
an insulator or oxide layer formed on the substrate to serve as a back-gate dielectric;
a semiconducting channel formed on the back-gate dielectric layer;
metallic layers formed in and/or on the semiconducting channel to define a source contact and a drain contact;
an insulator or oxide layer to serve as a top-gate dielectric;
a metallic layer formed on the top-gate dielectric to define the top-gate
a plurality of fullytop-gated FET devices; and
a biomimetic audiomorphic device, comprising:
a substrate to serve as a back-gate;
an insulator or oxide layer formed on the substrate to serve as a back-gate dielectric;
a semiconducting channel formed on the back-gate dielectric layer;
metallic layers formed in and/or on the semiconducting channel to define a source contact and a drain contact;
an insulator or oxide layer to serve as a top-gate dielectric; and
a metallic layer formed on the top-gate dielectric to define a plurality of split-gate pairs;
wherein each individual split-gate is connected to the drain contact of an individual fullytop-gated FET device.

15. The device of claim 14, wherein, when in operation:
the back-gate is biased at a voltage $V_{BG}$, the source contact is grounded, and the drain contact is biased at a drain-to-source voltage $V_{DS}$, the top-gate is biased at a voltage $V_{TG}$, and a source-to-drain current IDS flows through the semiconducting channel.

* * * * *